(12) United States Patent
Ishikawa

(10) Patent No.: US 7,969,343 B2
(45) Date of Patent: Jun. 28, 2011

(54) SUCCESSIVE APPROXIMATION ANALOG-DIGITAL CONVERTER CIRCUIT USING CAPACITANCE ARRAY

(75) Inventor: Kiyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/685,438

(22) Filed: Jan. 11, 2010

(65) Prior Publication Data

US 2010/0176983 A1     Jul. 15, 2010

(30) Foreign Application Priority Data

Jan. 15, 2009   (JP) ................................. 2009-006498

(51) Int. Cl.
*H03M 1/12*     (2006.01)
(52) U.S. Cl. ........................................ 341/172; 341/155
(58) Field of Classification Search ........... 341/136–172
See application file for complete search history.

(56) References Cited

U.S. PATENT DOCUMENTS

| | | | | |
|---|---|---|---|---|
| 4,908,620 A * | 3/1990 | Fujisawa | ........................ | 341/108 |
| 6,400,302 B1 * | 6/2002 | Amazeen et al. | ............. | 341/172 |
| 6,707,403 B1 * | 3/2004 | Hurrell | ......................... | 341/120 |
| 6,882,295 B2 * | 4/2005 | Leung | ............................ | 341/155 |
| 6,950,052 B2 * | 9/2005 | Leung | ............................ | 341/172 |
| 6,954,167 B2 * | 10/2005 | Leung | ............................ | 341/154 |
| 6,985,101 B2 * | 1/2006 | Leung et al. | .................... | 341/172 |
| 7,188,199 B2 * | 3/2007 | Leung et al. | ..................... | 710/69 |
| 7,230,561 B2 * | 6/2007 | Lee | ................................ | 341/172 |
| 7,233,273 B2 | 6/2007 | Tachibana et al. | | |
| 7,741,981 B1 * | 6/2010 | Wan et al. | ...................... | 341/110 |
| 7,834,796 B2 * | 11/2010 | Xu et al. | ........................ | 341/172 |

FOREIGN PATENT DOCUMENTS

JP        2007-142863 A     6/2007

* cited by examiner

*Primary Examiner* — Lam T Mai
(74) *Attorney, Agent, or Firm* — Fujitsu Patent Center

(57) ABSTRACT

An analog-to-digital converter circuit includes: a capacitor array including a plurality of first capacitors, each having a first terminal connecting to a common node and having a capacitance represented by the nth power of 2 ($2^n$) on the basis of the smallest of the capacitances of the first capacitors=1; a second capacitor for contributing to attenuation of the voltage on the common node; a switch array, each switch of the switch array supplying and disconnecting one of a first reference voltage, a second reference voltage, and the voltage of an input signal to and from a second terminal of an associated one of the first capacitors; a second switch supplying and disconnecting a third reference voltage to and from the common node; a comparator comparing a voltage on the common node with the third reference voltage; and a control circuit controlling the first switches and the second switch.

10 Claims, 15 Drawing Sheets

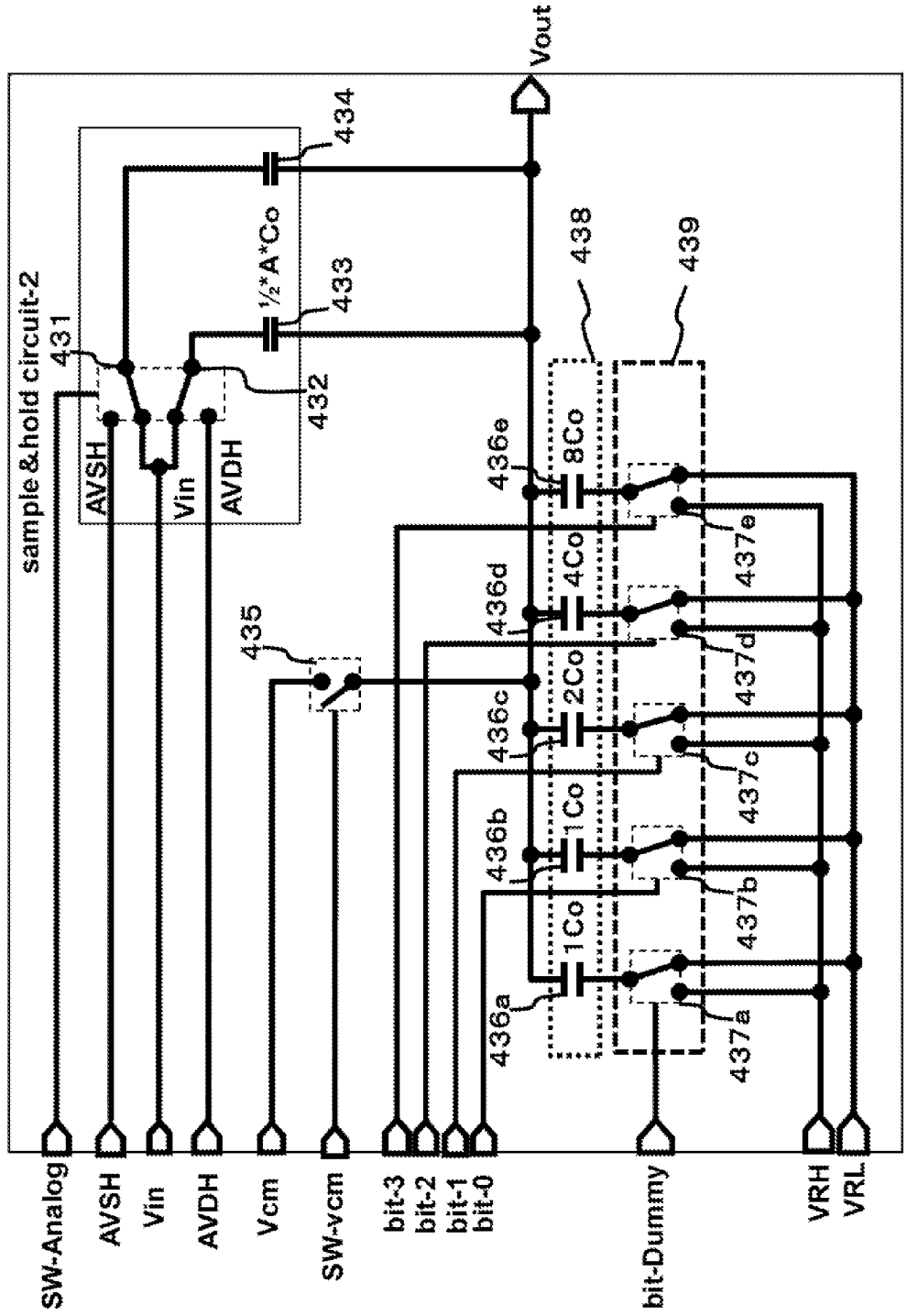

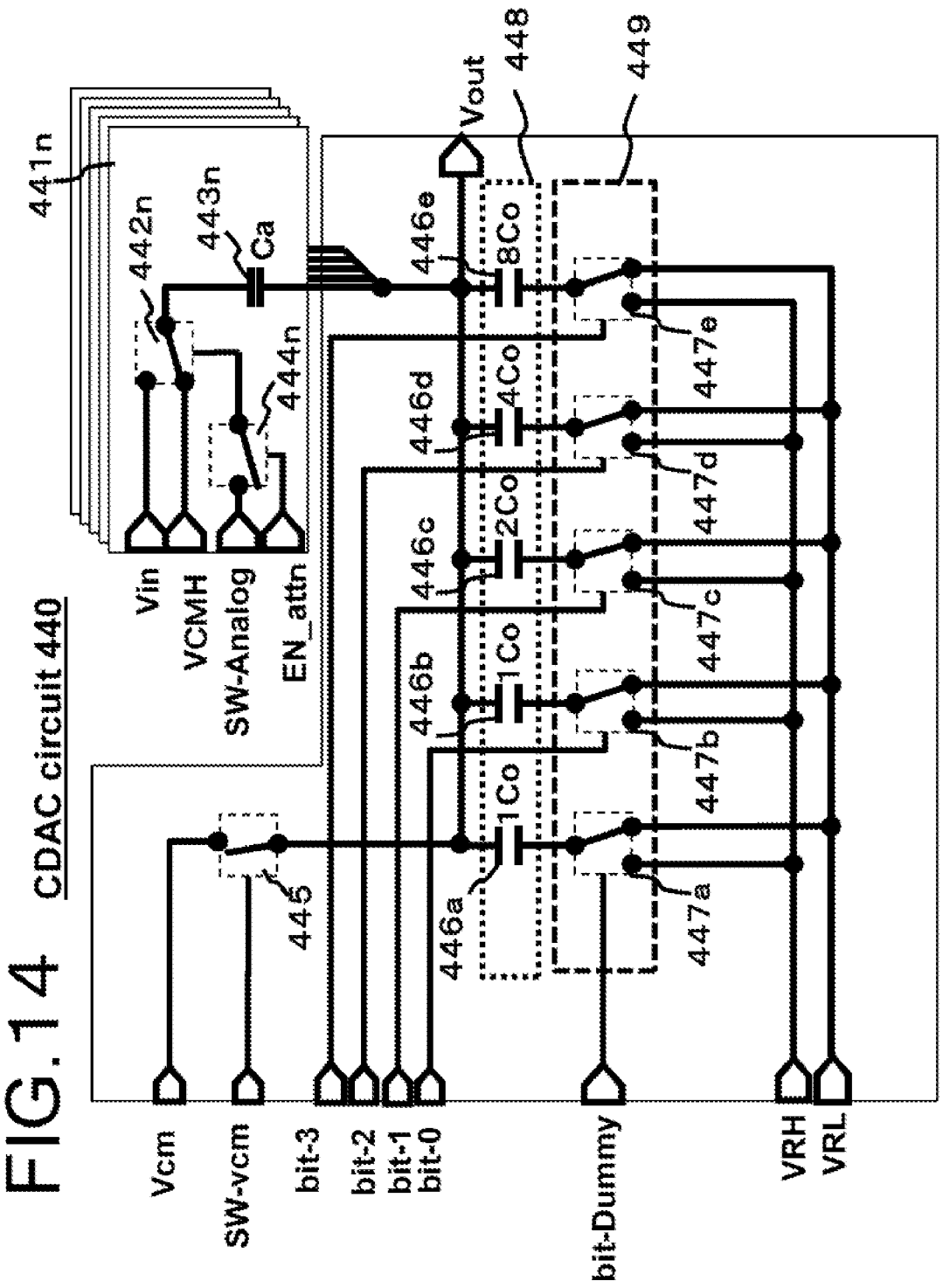

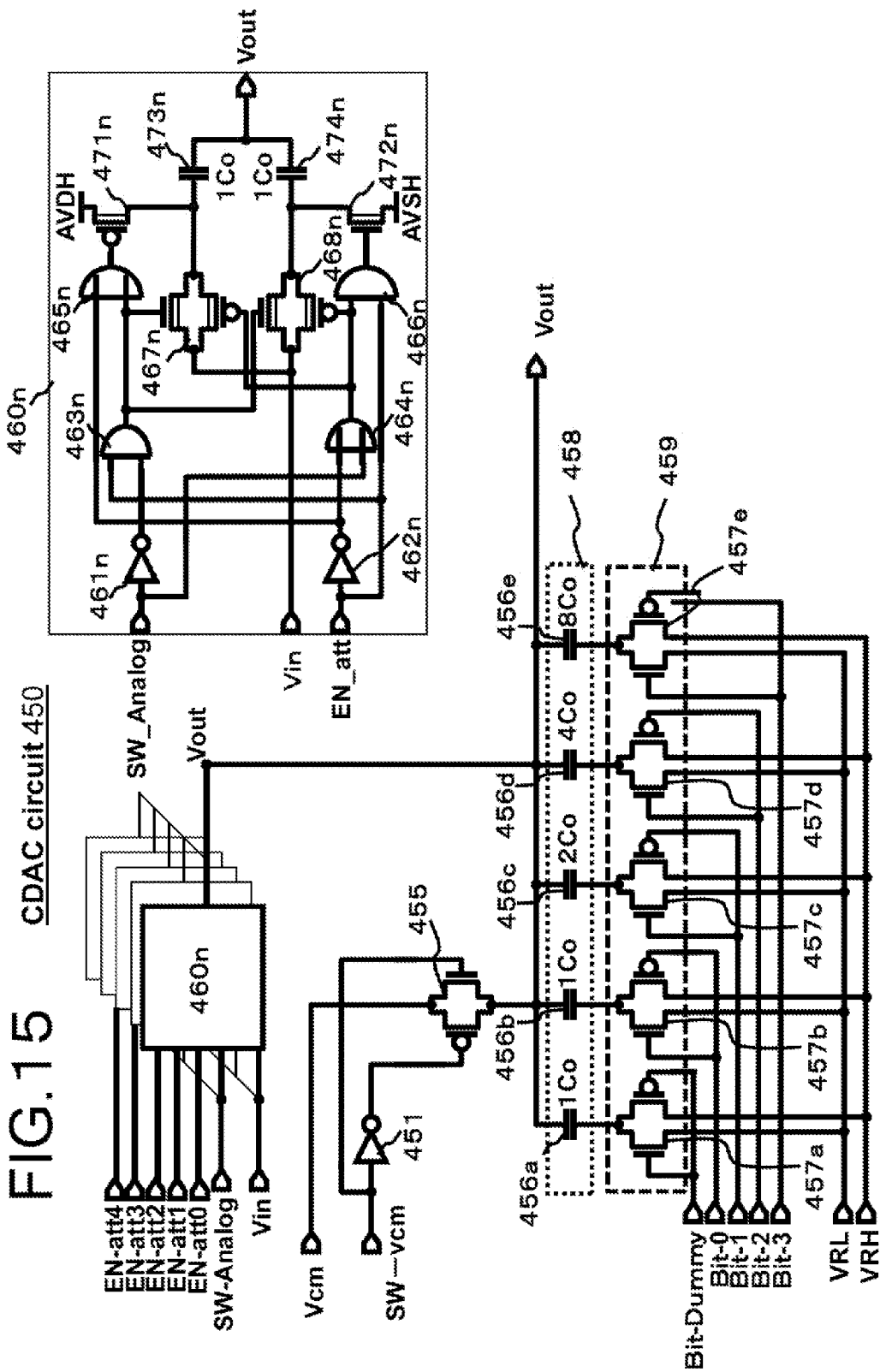

US 7,969,343 B2

SUCCESSIVE APPROXIMATION ANALOG-DIGITAL CONVERTER CIRCUIT USING CAPACITANCE ARRAY

CROSS REFERENCE TO RELATED APPLICATION

This application is based upon and claims the benefit of priority from the prior Japanese Patent Application NO. 2009-006498 filed on Jan. 15, 2009, the entire contents of which are incorporated herein by reference.

FIELD

The embodiments discussed herein are related to a successive approximation analog-to-digital converter circuit and a receiver including the analog-to-digital converter circuit.

BACKGROUND

A successive approximation analog-to-digital converter using a capacitance array is being used because of its relatively simple circuit configuration. The successive approximation analog-to-digital converter uses the capacitance array to produce voltage with levels varying as the nth power of 2 ($2^n$) and successively compares the voltage with the voltage of an input analog signal, thereby digitizing the analog signal. Related art is discussed in Japanese Laid Open Patent Publication No. 2007-142863.

SUMMARY

According to an aspect of the embodiments, an analog-to-digital converter circuit including: a capacitor array including a plurality of first capacitors, each having a first terminal connecting to a common node and having a capacitance represented by the nth power of 2 ($2^n$) (where n is a positive integer) on the basis of the smallest of the capacitances of the first capacitors=1; a second capacitor connected to the common node and contributing to attenuation of the voltage on the common node; a switch array including a plurality of first switches, each supplying and disconnecting one of a first reference voltage, a second reference voltage, and the voltage of an input signal to and from a second terminal of an associated one of the first capacitors; a second switch connected to the common node and supplying and disconnecting a third reference voltage to and from the common node; a comparator comparing a voltage on the common node with the third reference voltage; and a control circuit controlling the supply and disconnection by the first switches and the supply and disconnection by the second switch.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIG. 13 illustrates a CDAC circuit 430 according to a fifth exemplary embodiment;

FIG. 14 illustrates a CDAC circuit 440 according to a sixth exemplary embodiment; and FIG. 15 illustrates a CDAC circuit 450 according to a seventh exemplary embodiment.

DESCRIPTION OF EMBODIMENTS

The present invention encompasses, in addition to the exemplary embodiments described herein, design modifications to the exemplary embodiments which may occur to those skilled in the art and combinations of any components that appear in the exemplary embodiments. The present invention also encompasses implementations in which a component is replaced with another component that has the same effects and is not limited to the exemplary embodiments described herein.

First Exemplary Embodiment

A radio frequency (RF) receiver detects a signal received at an antenna, amplifies the received signal, converts the amplified analog signal to a digital signal, and inputs the digital signal into a digital signal processor (DSP), which outputs demodulated data. In order to reduce the receiver in size, system on chip (SOC) may be used which integrates a system including an amplifier, an analog-to-digital converter, and a digital signal processor (DSP) into a single chip.

The DSP may be a logic circuit containing MOS transistors driven by a low voltage, for example approximately 1.2 V, because they have been miniaturized using miniaturization technology. Low-voltage MOS transistors may be used in the logic circuit. On the other hand, MOS transistors contained in the amplifier may be driven by a high voltage, for example 3.3 V, because the signal-to-noise ratio, the ratio of signal amplitude to noise, needs to be sufficiently large. High-voltage MOS transistors may be used in the amplifier. Accordingly, in the SOC receiver it is desirable that after the analog signal is converted to a logic signal by the analog-to-digital converter, the voltage of the logic signal be converted to a low voltage, since desirably the analog-to-digital converter handles the signal with a large amplitude output from the amplifier without reducing the amplitude in order to maintain the signal-to-noise ratio, namely the ratio of the signal amplitude, to noise to improve the accuracy of analog-to-digital conversion. In the successive approximation analog-to-digital converter using capacitance array, high-voltage MOS transistors are used in the design of the capacitance array, comparator, and other control circuits. It may be difficult to apply miniaturization technology to high-voltage MOS transistors because reduction of the size of the gate electrodes of MOS transistors and the thickness of gate insulating films means reduction of the driving voltage. A high-voltage MOS transistor occupies a larger area than a low-voltage MOS transistor. Since the miniaturization technology may not be applied, the thickness of insulating films used in capacitors of the capacitance array and the area of capacitors increase.

Figure 1:
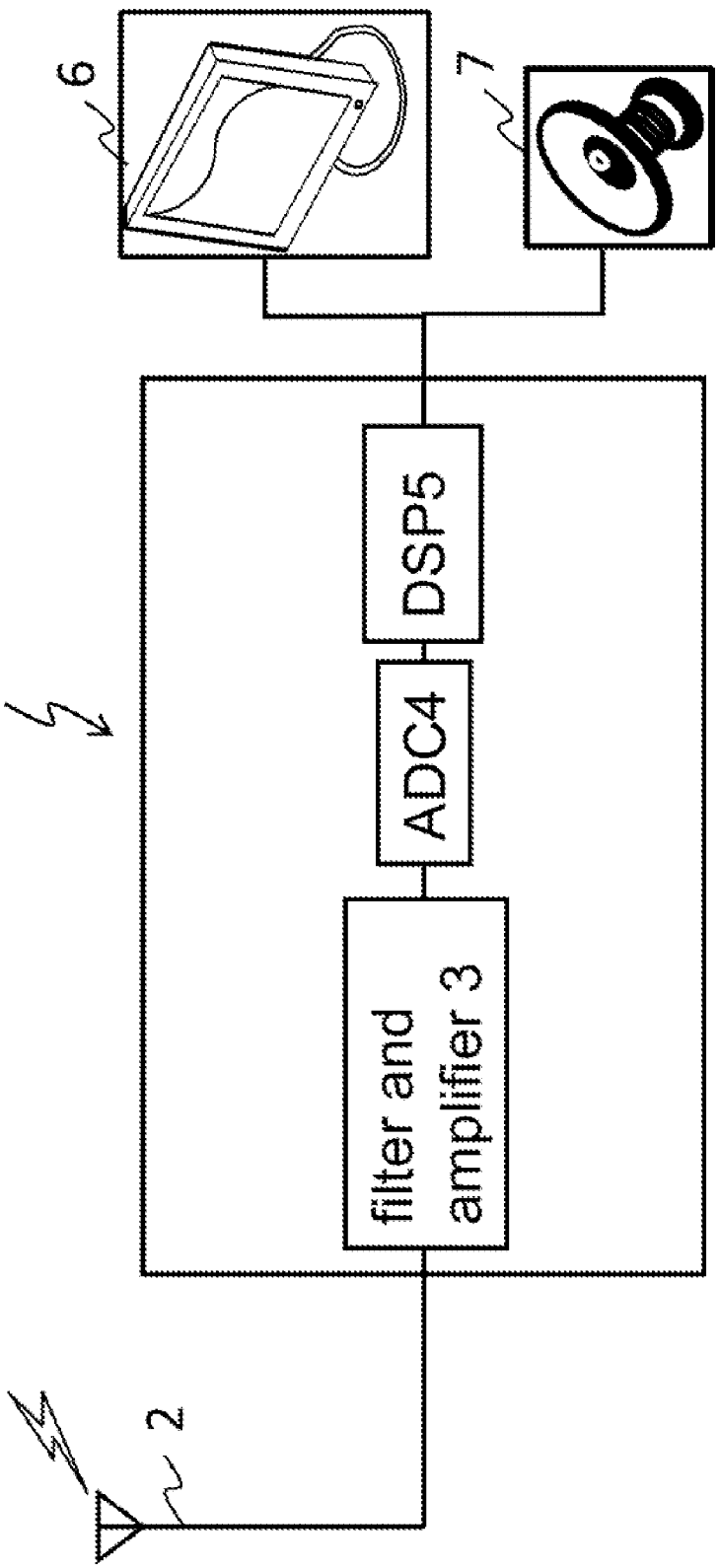
FIG. 1 illustrates an RF receiver 1 using an analog-to-digital converter circuit 4 according to a first exemplary embodiment.

FIG. 1 illustrates an RF receiver 1 using an analog-to-digital converter circuit 4 according to a first exemplary embodiment. The RF receiver 1 includes a filter and amplifier 3, an analog-to-digital converter circuit (ADC) 4, and a digital signal processor (DSP) demodulator 5. The RF receiver 1 is a circuit that recovers an original signal from a modulated signal received at an antenna 2. The filter section of the filter and amplifier 3 reduces noise in a modulated signal and the amplifier section of the filter and amplifier 3 amplifies the signal. The analog-to-digital converter circuit 4 is a circuit that converts an input modulated signal to a digital signal. The DSP demodulator 5 is a circuit that receives a signal digitized by the analog-to-digital converter circuit 4, recovers the original unmodulated signal from the modulate signal, and outputs the recovered signal to a display device 6 or an audio device 7. The original unmodulated signal is a signal such as a signal related to image data for the display device 6 or a signal related to sound for the audio device 7.

Figure 2:
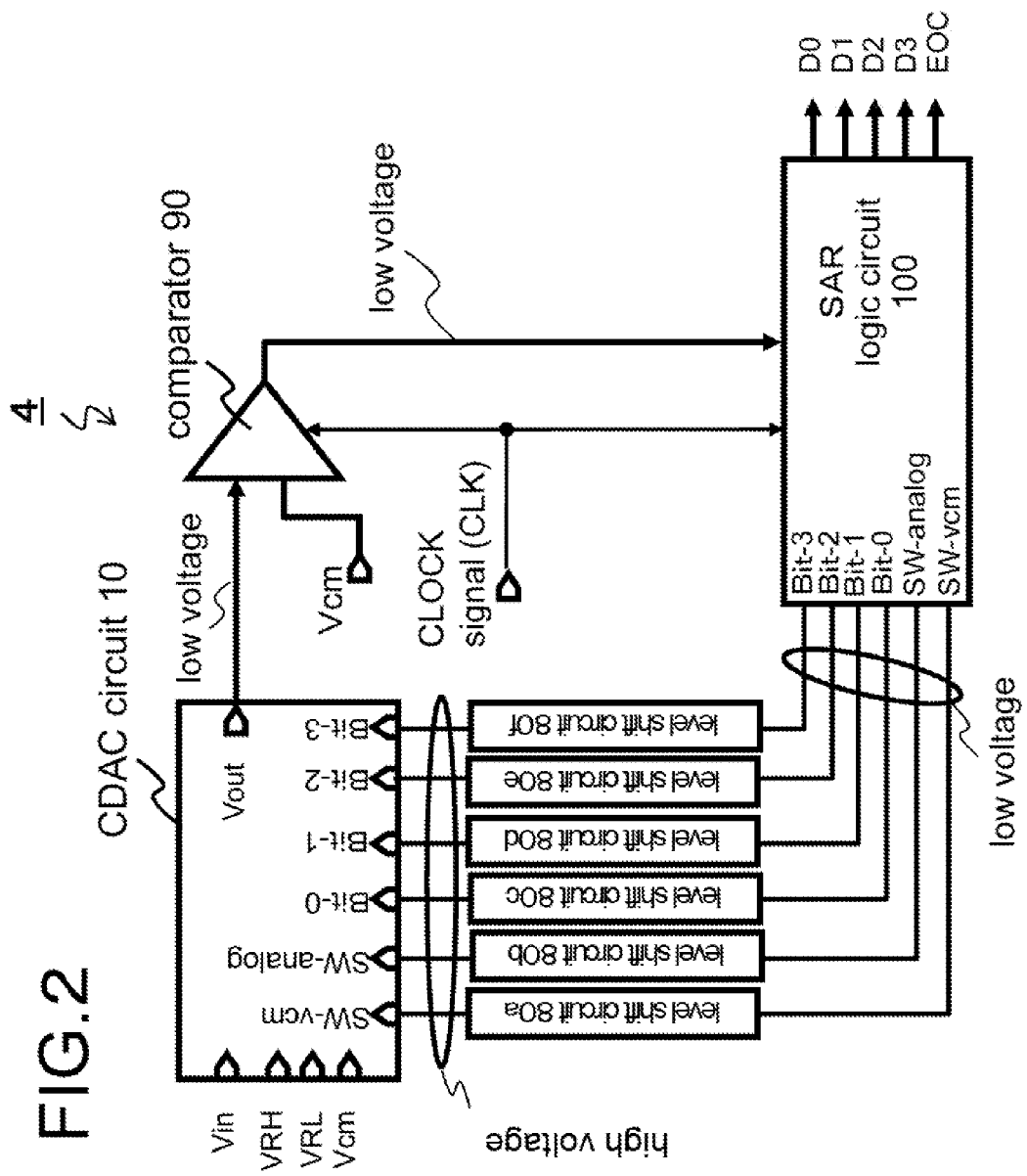
FIG. 2 illustrates the analog-to-digital converter circuit 4 according to the first exemplary embodiment.

FIG. 2 illustrates the analog-to-digital converter circuit 4 according to the first exemplary embodiment. The analog-to-digital converter circuit 4 includes a capacitor digital analog converter (CDAC) circuit 10, a comparator 90, a successive approximation register (SAR) logic circuit 100, and level shift circuits 80a, 80b, 80c, 80d, 80e, and 80f. The level shift circuits 80a, 80b, 80c, 80d, 80e, and 80f are circuits that when receiving a signal with a small amplitude and a low peak amplitude voltage, outputs a signal that is synchronous with the received signal and has a large amplitude and a high peak amplitude voltage.

The CDAC circuit 10 samples an input signal Vin input into the analog-to-digital converter circuit 4 in order to determine a digital signal corresponding to the analog voltage Vins of the input signal Vin, then produces a successive approximation signal Vout used for determining the logic of each bit of the digital signal on the basis of the sampled input signal Vin, and outputs the successive approximation signal Vout to the comparator 90. The successive approximation signal Vout has a signal voltage Vouts that is the voltage of the sampled input signal Vin attenuated at a certain rate. The CDAC circuit 10 produces the successive approximation signal Vout under the control of the SAR logic circuit 100 and receives signals used for the control, namely signals SW-VCM, SW-analog, Bit-0, Bit-1, Bit-2, and Bit-3, from the SAR logic circuit 100. The CDAC circuit 10 also receives a high-voltage signal VRH having a constant high voltage, a low-voltage signal VRL having a constant low voltage lower than the high voltage of VRH, and a reference signal Vcm having a reference voltage intermediate between the high and low voltages in order to produce the successive approximation signal Vout. Operation of the CDAC circuit 10 and the successive approximation signal Vout will be described later in detail with respect to FIG. 3.

The comparator 90 compares the voltage Vouts of the successive approximation signal Vout output from the CDAC circuit 10 with the reference voltage Vcms of the reference signal Vcm and, if the voltage Vouts is higher than the reference voltage Vcms, outputs a logic-low successive comparison result signal and, if the voltage Vouts is lower than the reference voltage Vcms, outputs a logic-high successive comparison result signal.

The SAR logic circuit 100 controls the CDAC circuit 10 to produce the successive approximation signal Vout on the basis of the input signal Vin sampled by the CDAC circuit 10 in synchronization with an input clock signal and controls the CDAC circuit 10 to store the voltage Vouts of the successive approximation signal Vout.

In order to control the CDAC circuit 10, the SAR logic circuit 100 outputs signals Bit-0, Bit-1, Bit-2, Bit-3, SW-analog, and SW-vcm to the CDAC circuit 10.

Based on the logic of the successive comparison result signal output from the comparator 90 which has received the successive approximation signal Vout, the SAR logic circuit 100 determines each bit of a digital signal D[3:0] corresponding to the analog voltage of the sampled input signal Vin and outputs logic signals corresponding to the bits (signals D3, D2, D1, and D0) and an end of conversion (EOC) signal indicating the end of conversion. Control of the CDAC circuit 10 by the SAR logic circuit 100 and determination of the digital signal will be described later with respect to FIGS. 5 and 6.

Figure 3:
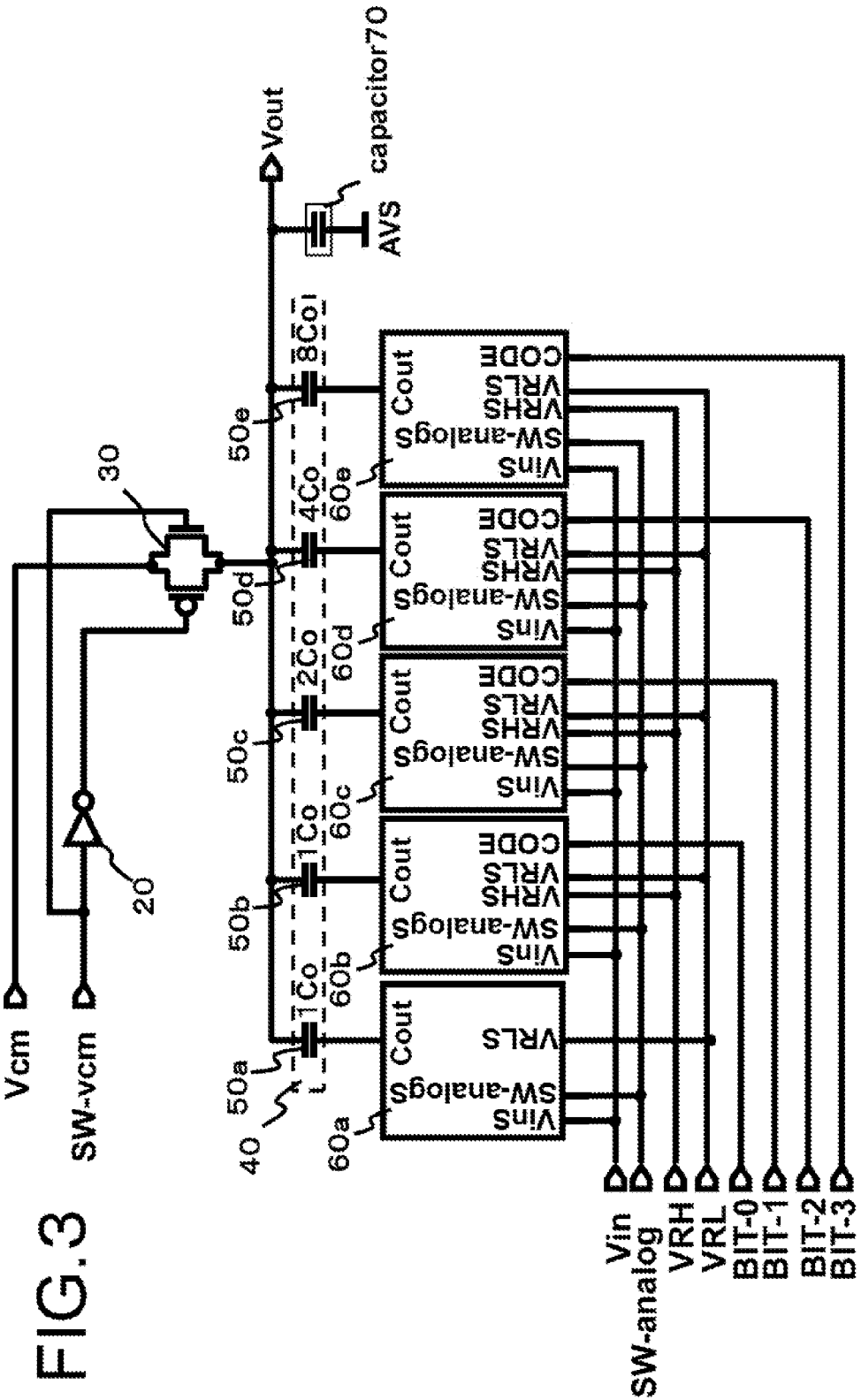
FIG. 3 illustrates a CDAC circuit 10 in the first exemplary embodiment.

FIG. 3 illustrates the CDAC circuit 10 in the first exemplary embodiment. The CDAC circuit 10 includes an inverter circuit 20 which outputs an inverted signal, a switch circuit 30, a capacitor array 40 including capacitors 50a, 50b, 50c, 50d, and 50e, switch circuits 60a, 60b, 60c, 60d, and 60e associated with the capacitors 50a, 50b, 50c, 50d, and 50e, respectively, and a capacitor 70.

The inverter circuit 20 receives the SW-vcm signal at its input terminal, inverts the logic of the SW-vcm signal, and outputs the inverted SW-vcm signal.

The switch circuit 30 includes a PMOS transistor and an NMOS transistor connected in parallel between the input and output terminals. The inverted SW-vcm signal is connected to the gate electrode of the PMOS transistor and the SW-vcm signal is connected to the gate electrode of the NMOS transistor. The reference signal Vcm having a reference voltage is connected to the input terminal and a common node of the capacitor array 40 is connected to the output terminal.

The capacitor array 40 includes multiple capacitors 50a, 50b, 50c, 50d, and 50e. One of the electrodes of each of the capacitors 50a, 50b, 50c, 50d, and 50e is connected to the common node. On the basis of the smallest of the capacitances of the capacitors 50a, 50b, 50c, 50d, and 50e=1. The other capacitors have capacitances that are represented by $2^n$ (where n is a positive integer). That is, the capacitor array 40 includes capacitors having so-called binary-weighted capacitance values. Specifically, if the capacitance of capacitor 50a is 1×Co (where Co is a positive constant), the capacitance of capacitor 50b is 1×Co, the capacitance of capacitor 50c is 2×Co, the capacitance of capacitor 50d is 4×Co, and the capacitance of capacitor 50e is 8×Co.

The common node is connected to a terminal at which the successive approximation signal Vout is output and has a voltage equal to that of the successive approximation signal Vout.

Each of the switch circuits 60b, 60c, 60d, and 60e has terminal Cout connecting to the other electrode (the electrode that is not connected to the common node) of the associated one of the capacitors 50b, 50c, 50d, and 50e. The switch circuits 60b, 60c, 60d and 60e has terminal CODE connecting to signals Bit-0, Bit-1, Bit-2, and Bit-3, respectively, output from the SAR logic circuit 100. Each of switch circuits 60b, 60c, 60d, and 60e has terminal SW-analogs connecting to the signal SW-analog output from the SAR logic circuit 100. Each of switch circuits 60b, 60c, 60d, and 60e has terminals VinS, VRHS, and VRSL connecting to the input signal Vin, high-voltage signal VRH, and low-voltage signal VRL, respectively. Switches 60b, 60c, 60d, and 60e will be described later in detail with respect to FIG. 4.

Switch circuit 60a has terminal Cout connecting to the other electrode (the electrode that is not connected to the common node) of capacitor 50a. Switch circuit 60a has terminal SW-analogS connecting to signal Sw-analog output from the SAR logic circuit 100. Terminals VinS and VRLS of switch circuit 60a connect to the input signal Vin and low-voltage signal VRL, respectively. Switch circuit 60a will be described later in detail with respect to FIG. 4.

One of the electrodes of the capacitor 70 is connected to the common node and the other electrode is connected to a signal AVS having a constant voltage. The constant voltage of the signal AVS is lower than the lowest voltage of the voltage amplitude of the input signal Vin. The capacitor 70 has the function of attenuating the voltage on the common node according to the capacitance of the capacitor 70 and the total capacitance of the multiple capacitors 50a, 50b, 50c, 50d, and 50e included in the capacitor array 40. Contribution of the capacitor 70 to attenuation of the voltage on the common node will be described later by using Equations (3) and (13).

Figure 4:
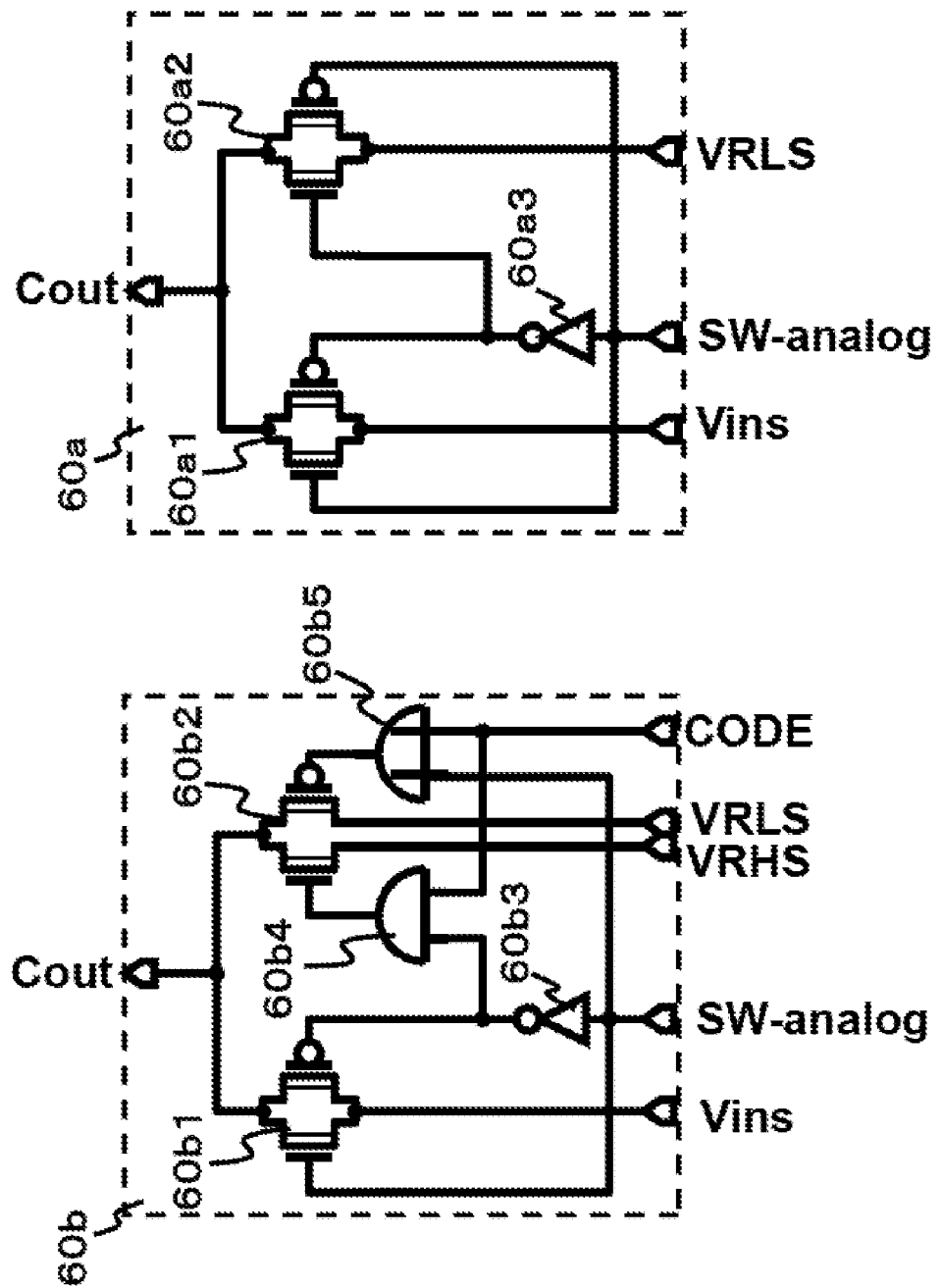
FIG. 4 is a schematic diagram illustrating switch circuits 60a and 60b in the first exemplary embodiment.

FIG. 4 is a schematic diagram illustrating switch circuits 60a and 60b in the first exemplary embodiment. Switch circuits 60c, 60d, and 60e are identical to the switch circuit 60b and therefore repeated description of switch circuits 60c, 60d, and 60e will be omitted.

Switch circuit 60b includes switches 60b1 and 60b2, an inverter 60b3, an AND circuit 60b4, and an OR circuit 60b5.

The inverter 60b3 is an inverter circuit that receives signal SW-analog, inverts the logic of signal SW-analog and outputs the inverted SW-analog signal.

Switch 60b1 includes first and second terminals and a P-channel transistor and an N-channel transistor are provided in parallel between the first and second terminals. The first terminal receives the input signal Vin and the second terminal is connected to capacitor 50b of the capacitor array 40. The gate electrode of the P-channel transistor receives the inverted SW-analog signal and the gate electrode of the N-channel transistor receives the SW-analog signal. Since the voltage amplitude of the input signal Vin is large, the P-channel transistor and the N-channel transistor of the switch 60b1, which turn on and off the input signal Vin, are high-voltage MOS transistors. Accordingly, the other components, switch 60b2, inverter 60b3, AND circuit 60b4, and OR circuit 60b5, have also high-voltage MOS transistors. Accordingly, the signals SW-analog, Bit-1, and Bit-2, Bit-3 need to have a high-voltage amplitude. The MOS transistors of the SAR logic circuit 100 are low-voltage MOS transistors and therefore may handle only a low-voltage amplitude. Therefore, as illustrated in FIG. 2, the signals SW-analog, Bit-1, Bit-2, and Bit-3 from the SAR logic circuit 100 are converted to high-level signals by the level shift circuits 80a, 80b, 80c, 80d, 80e, and 80f. Switch 60b2 includes first, second and third terminals, a P-channel transistor provided between the first and third terminals, and an N-channel transistor provided between the second and third terminals. The first terminal receives the low-voltage signal VRL, the second terminal receives the high-voltage signal VRH, and the third terminal connects to capacitor 50b of the capacitor array 40. The gate electrode of the P-channel transistor receives an output signal from the OR circuit 60b5 and the gate electrode of the N-channel transistor receives an output signal from the AND circuit 60b4.

One of the input terminals of the AND circuit 60b4 receives the inverted SW-analog signal and the other input terminal receives a CODE signal. The CODE signal in the switch circuit 60b is signal Bit-0. The AND circuit 60b4 outputs a signal having the logic equivalent to the logical AND of the logic of inverted SW-analog signal and the logic of the CODE signal.

One of the input terminals of the OR circuit 60b5 receives the SW-analog signal and the other input terminal receives the CODE signal. The CODE signal in the switch circuit 60b is signal Bit-0. The OR circuit 60b4 outputs a signal having the logic equivalent to the logic OR of the logic of the SW-analog signal and the logic of the CODE signal.

With the configuration described above, the switch circuit 60b connects one of the input signal Vin, low-voltage signal VRL, and high-voltage signal VRH to capacitor 50b according to signals Bit-0 and SW-analog from the SAR logic circuit 100. Similarly, the switch circuit 60c connects one of the input signal Vin, low-voltage signal VRL, and high-voltage signal VRH to capacitor 50c according to signals Bit-1 and SW-analog from the SAR logic circuit 100. The switch circuit 60d connects one of the input signal Vin, low-voltage signal VRL, and high-voltage signal VRH to capacitor 50d according to signals Bit-2 and SW-analog from the SAR logic circuit 100. The switch circuit 60e connects one of the input signal Vin, low-voltage signal VRL, and high-voltage signal VRH to capacitor 50e according to signals Bit-3 and SW-analog from the SAR logic circuit 100.

Operation of the switch circuits 60b, 60c, 60d, and 60e will be described later in detail with respect to FIGS. 5 and 6 in conjunction with control operation of the SAR logic circuit 100.

Switch circuit 60a includes switches 60a1 and 60a2, and an inverter 60a3.

The inverter 60a3 is an inverter circuit that receives signal SW-analog, inverts the logic of the signal SW-analog, and output an inverted SW-analog signal.

Switch 60a1 includes first and second terminals, and a P-channel transistor and an N-channel transistor which are provided in parallel between the first and second terminals. The first terminal receives the input signal Vin and the second terminal connects to capacitor 50a of the capacitor array 40. The gate electrode of the P-channel transistor receives the inverted SW-analog signal and the gate electrode of the N-channel transistor receives the SW-analog signal.

Switch 60a2 includes first and second terminals, and a P-channel transistor and an N-channel transistor are provided in parallel between the first and second terminals. The first terminal receives the low-voltage signal VRL and the second terminal connects to capacitor 50a of the capacitor array 40. The gate electrode of the P-channel transistor receives the SW-analog signal and the gate electrode of the N-channel transistor receives the inverted SW-analog signal.

With the configuration described above, the switch circuit 60a connects one of the input signal Vin and low-voltage signal VRL to capacitor 50a according to the SW-analog signal from the SAR logic circuit 100. Operation of the switch circuits 60b, 60c, 60d, and 60e will be described later in detail with respect to FIGS. 5 and 6 in conjunction with control operation of the SAR logic circuit 100.

Figure 5:
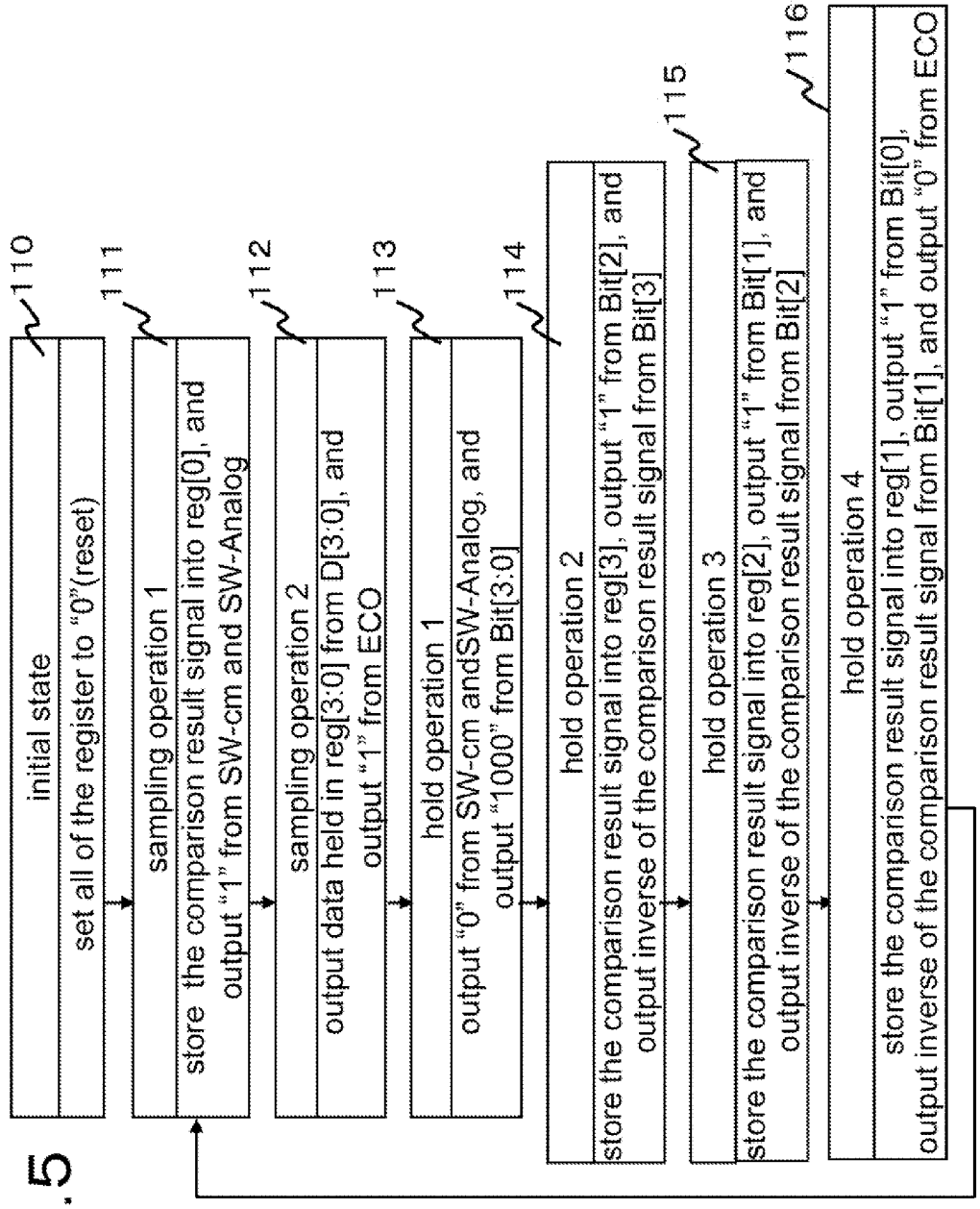
FIG. 5 is a flowchart illustrating control operation performed by an SAR logic circuit 100.

FIG. 5 is a flowchart illustrating control operation of the SAR logic circuit 100.

In the initial state 110, the SAR logic circuit 100 resets four registers Reg0, Reg1, Reg2, and Reg3, each holding one bit of a digital signal corresponding to an input signal Vin having an analog voltage.

In sampling operation 1 (111), the SAR logic circuit 100 stores in register Reg0 the voltage on the common node of the CDAC circuit 10, that is, the logic of the comparison result signal output from the comparator 90 as a result of comparison between the voltage Vouts of a successive approximation signal Vout and the voltage Vcms of a reference signal Vcm. The logic circuit 100 then outputs a logic-high SW-vcm signal and a logic-high SW-analog signal. The reference signal Vcm is coupled onto the common node through the switch circuit 30. The input signal Vin is connected to capacitors 50a, 50b, 50c, 50d, and 50e through switch circuits 60a, 60b, 60c, 60d, and 60e, respectively.

Here, let the capacitance of capacitor 70 be C1, the capacitances of capacitors 50a, 50b, 50c, 50d, and 50e be C0, C0, 2C0, 4C0 and 8C0, respectively, the voltage of signal AVS be Vavs, the voltage of the reference signal Vcm be Vcms, the voltage of signal VRH be Vrhs, the voltage of signal VRL be Vrls, and the voltage of the input signal Vin be Vins, and the voltage of the successive approximation signal Vout that appears on the common node be Vouts.

Then charge Q1 stored on the common node when the input signal Vin is sampled is expressed as:

$$Q1=(Vcms-Vins)\times 16C0+(Vcms-Vavs)\times C1 \quad \text{Equation (1)}$$

While the sum of the total capacitance of capacitors 50a, 50b, 50c, 50d, and 50e is 16C0 herein, the total capacitance may be B×C0 if the capacitor array 40 includes more capacitors, where B is an integer equal to $2^n$ (n is a positive integer).

In that case, Q1 is expressed as:

$$Q1=(Vcms-Vins)\times BC0+(Vcms-Vavs)\times C1 \quad \text{Equation (11).}$$

In sampling operation 2 (112), the SAR logic circuit 100 outputs data held in registers Reg0, Reg1, Reg2, and Reg3 as signals D0, D1, D2, and D3. The SAR logic circuit 100 also outputs a logic-high EOC signal.

In hold operation 1 (113), the SAR logic circuit 100 outputs a logic-low SW-vcm signal and a logic-low SW-analog signal. As a result, the reference signal Vcm is disconnected from the common node and the input signal Vin is disconnected from capacitors 50a, 50b, 50c, 50d, and 50e by switch circuits 60a, 60b, 60c, 60d, and 60e, respectively. The SAR logic circuit 100 then outputs a logic-low Bit-0 signal, a logic-low Bit-1 signal, a logic-low bit-2 signal, and a logic-high Bit-3 signal. This state is referred to herein as "setting a bit signal {1000}". The digits in { } represent the logics of bit signals Bit-3, Bit-2, Bit-1, and Bit-0, from left to right. As a result, the high-voltage signal VRH is connected to capacitor 50e by switch circuit 60e and the low-voltage signal VRL is connected to capacitors 50a, 50b, 50c, and 50d by switch circuits 60a, 60b, 60c, and 60d, respectively.

The charge Q2 stored on the common node during hold operation 1 is expressed as:

$$Q2=(Vouts-Vrhs)\times A\times C0+(16-A)(Vout-Vrls)\times C0+(Vouts-Vavs)\times C1 \quad \text{Equation (2)}$$

where A is a constant obtained by dividing the total capacitance of the capacitor(s) connected to the high-voltage signal VRH among capacitors 50b, 50c, 50d, and 50e by C0. In hold operation 1, A equals 8.

If the capacitor array 40 includes more capacitors and the total capacitance is BC0 as mentioned above, Q2 is expressed as:

$$Q2=(Vouts-Vrhs)\times A\times C0+(B-A)(Vouts-Vrls)\times C0+(Vouts-Vavs)\times C1 \quad \text{Equation (12)}$$

Here, Q1 is equal to Q2 (Q1=Q2) according to the law of conservation of charge. Therefore, Vouts is derived from Equations (1) and (2) as:

$$Vouts=Vcms-(16Vins-A-Vrhs-(16-A)\cdot Vrls)\times C0/(16\cdot C0+C1) \quad \text{Equation (3)}$$

Similarly, if the capacitor array 40 includes more capacitors and the total capacitance is BC0, Q3 is expressed as:

$$Vouts=Vcms-(B\cdot Vins-A\cdot Vrhs-(B-A)\cdot Vrls)\times C0/(B\cdot C0+C1) \quad \text{Equation (13)}$$

It is seen from Equation (3) that the voltage Vouts of the successive approximation signal Vout that appears on the common node is attenuated by the capacitor 70 connected to the common node because the values of the terms other than Vcms decreases as the capacitance C1 of the capacitor 70 increases.

After hold operation 1, the voltage on the common node of the CDAC circuit 10 is compared with the voltage Vcms of the reference signal Vcm. If the voltage on the common node is higher, the comparator 90 outputs a logic-low comparison result signal and the logic of signal D3 representing the most significant bit of the digital signal becomes low. On the other hand, if the voltage on the common node is lower, the comparator 90 outputs a logic-high comparison result signal and the logic of signal D3 representing the most signal bit of the digital signal becomes high.

In hold operation 2 (114), the SAR logic circuit 100 stores in register Reg3 corresponding to the most significant bit D3 the logic of the comparison result signal output from the comparator 90 as a result of the comparison between the voltage on the common node of the CDAC circuit 10, that is, the voltage Vouts of the successive approximation signal Vout, and the voltage Vcms of the reference signal Vcm.

The SAR logic circuit 100 then outputs a logic-high Bit-2 signal and also outputs a Bit-3 signal having the logic opposite to the logic of the comparison result signal output from the comparator 90. Consequently, after hold operation 1, if the voltage on the common node is higher than Vcms, a bit signal {0100} is set in hold operation 2. If the voltage on the common node is lower than Vcms, a bit signal {1100} is set in hold operation 2. Therefore, if the bit signal {1100} is set, A in Equation (3) will be 12; if the bit signal {0100} is set, A will be 4.

After hold operation 2, the voltage on the common node of the CDAC circuit 10 is compared with the voltage Vcms of the reference signal Vcm. If the voltage on the common node is higher, the comparator 90 outputs a logic-low comparison result signal and signal D2 representing the third bit of the digitals signal becomes logic-high. On the other hand, if the voltage on the common node is lower, the comparator 90 outputs a logic-high comparison result signal and signal D2 representing the third bits of the digital signal becomes logic-low.

In hold operation 3 (115), the SAR logic circuit 100 stores in register Reg2 corresponding to bit D2 the logic of the comparison result signal output from the comparator as a result of comparison between the voltage on the common node of the CDAC circuit 10, that is, the voltage Vouts of the successive approximation signal Vout, and the voltage Vcms of the reference signal Vcm.

The SAR logic circuit 100 then outputs a logic-high Bit-1 signal and also outputs a Bit-2 signal having the logic opposite to the logic of the comparison result signal output from the comparator 90. Consequently, after hold operation 2, if the voltage on the common node (successive approximation signal Vouts) is higher than Vcms, a bit signal {X110} is set in hold operation 3; if the voltage on the common node is lower than Vcms, a bit signal {X010} is set in hold operation 3. Here, X is 1 or 0.

If the bit signal {0110} and {0010} are set as the result, A in Equation (3) will be 6 and 2, respectively. If the bit signal {1110} or {1010} is set, A will be 14 and 10, respectively.

After hold operation 3, the voltage on the common node of the CDAC circuit 10 is compared with the voltage Vcms of the reference signal Vcm. If the voltage on the common node is higher, the comparator 90 outputs a logic-low comparison result signal and signal D1 representing the second bit of the digital signal will be logic-high. On the other hand, if the voltage on the common node is lower, the comparator 90 outputs a logic-high comparison result signal and signal D1 representing the second bit of the digital signal will be logic-low.

In hold operation 4 (116), the SAR logic circuit 100 stores in register Reg1 corresponding to bit D1 the logic of the comparison result signal output from the comparator 90 as a result of the comparison between the voltage on the common node of the CDAC circuit 10, that is, the voltage Vouts of the successive approximation signal Vout, and the voltage Vcms of the reference signal Vcm.

The SAR logic circuit 100 then outputs a logic-low Bit-0 signal and a Bit-1 signal having the logic opposite to the logic of the comparison result signal from the comparator 90. Consequently, after hold operation 3, if the voltage on the common node is higher than Vcms, a bit signal {XX01} is set in hold operation 4; if the voltage on the common node is lower than Vcms, a bit signal {XX11} is set in hold operation 4. Here, X is an integer of 1 or 0.

As a result, if bit signal {1101}, {1001}, {0101}, and {0001} are set, A in Equation (3) will be 13, 9, 5, and 1, respectively. If bit signals {1111}, {1011}, {0111}, and {0011} are set, A will be 15, 1, 7, and 3, respectively.

After hold operation 4, the voltage on the common node of CDAC circuit 10 is compared with the voltage Vcms of the reference signal Vcm. If the voltage on the common node is higher, the comparator 90 outputs a logic-low comparison result signal and signal D0 representing the first bit of the digital signal becomes logic-high. On the other hand, if the voltage on the common node is lower, the comparator 90 outputs a logic-low comparison result signal and signal D0 representing the first bit of the digital signal becomes logic-high.

In summary, first the SAR logic circuit 100 outputs control signals (signals SW-vcm, SW-analog, Bit-0, Bit-1, Bit-2, and Bit-3) to the CDAC circuit 10.

As a result, if both of signals SW-vcm and SW-analog are logic-high, the reference signal Vcm is connected to the common node, therefore the voltage on the common node becomes Vcms, and charge expressed by Equation (1) is stored. That is, charge equivalent to the voltage Vins of the input signal Vin is sampled on the common node.

Then, the SAR logic circuit 100 forces signals SW-vcm and SW-analog logic-low. As a result, the input signal Vin is disconnected from capacitors 50*a*, 50*b*, 50*c*, 50*d* and 50*d* of the capacitor array 40 and the high-voltage signal VRH and the low-voltage signal VRL are connected instead. The SAR logic circuit 100 changes the logics of signals Bit-0, Bit-1, Bit-2, and Bit-3 to change combination of connections of the high-voltage signal VRH and the low-voltage signal VRL to capacitors 50*a*, 50*b*, 50*c*, 50*d*, and 50*e*.

The capacitances of capacitors 50*a*, 50*b*, 50*c*, 50*d*, and 50*e* are C0, C0, 2C0, 4C0, and 8C0, respectively. Therefore, when combination of connections of the high-voltage signal VRH and the low-voltage signal VRL is changed, the capacitance between the common node and the low-voltage signal VRL becomes (16−A)×C0 if the capacitance between the common node and the high-voltage signal VRH is A×C0, where A is an integer from 0 to 15. If the total capacitance of the capacitor array 40 is BC0, the capacitance between the common node and the low-voltage signal VRL is (B−A)×C0.

Then, from Equation (3), addition of the voltage determined by combination of the logics of signals Bit-0, Bit-1, Bit-2, and Bit-3 to the difference voltage between the voltage Vcms of the reference signal Vcm and the voltage Vins of the input signal Vin attenuated at a rate of 1/(1+C1/16/C0 (or 1/(1+C1/B/C0) if the total capacitance is BC0) yields the voltage on the common node, that is, the voltage Vouts of the successive approximation signal Vout. The voltage is changed in 16 levels by combinations of the logics of signals Bit-0, Bit-1, Bit-2, and Bit-3.

While the SAR logic circuit 100 performs hold operations 1, 2, 3, and 4, the comparator 90 successively compares the voltage Vouts of the successive approximation signal Vout with the voltage Vcms of the reference signal Vcm in synchronization with the clock signal CLK to determine whether the value of the second term (16·Vins−A·Vrhs−(16−A)·Vrls) of Equation (3) (or (B·Vins−A·Vrhs−(B−A)·Vrls) if the total capacitance is BC0) is positive or negative. The SAR logic circuit 100 controls combination of the logics of signals Bit-0, Bit-1, Bit-2, and Bit-3 through hold operations 1, 2, 3, and 4 so that (16−Vins−A·Vrhs−(16−A) ·Vrls) (or (B·Vins−A·Vrhs−(B−A)·Vrls) if the total capacitance is BC0) approaches 0. That is, the SAR logic circuit 100 controls combination of the logics of signals Bit-0, Bit-1, Bit-2, and Bit-3 to provide asymptotic behavior.

Consequently, the value of A that yields a value of the second term of Equation (3) that is closest to 0 is selected at the time of completion of hold operation 4 by the SAR logic circuit 100. The SAR logic circuit 100 outputs a digital signal D [3:0] that is the binary expression of the value of A.

Figure 6:
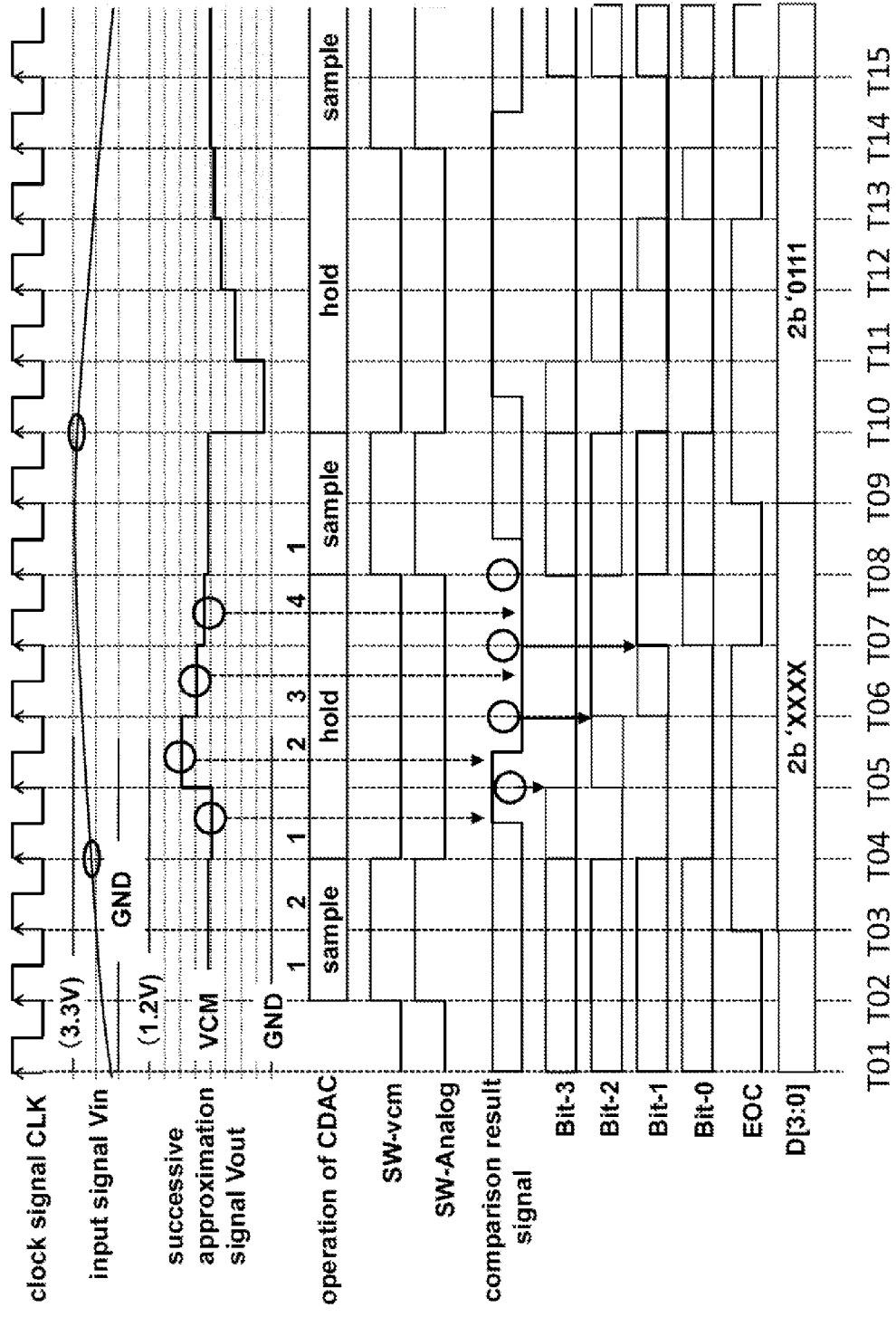
FIG. 6 is a timing chart illustrating operation of the SAR logic circuit 100.

FIG. 6 is a timing chart illustrating operation of the SAR logic circuit 100. FIG. 6 illustrates the clock signal CLK, input signal Vin, successive approximation signal Vout, signal SW-vcm, signal SW-analog, comparison result signal, signals Bit-0, Bit-1, Bit-2, Bit-3, and EOC, digital signal D [3:0] (signals D3, D2, D1, and D0) as well as CDAC operation.

The clock signal CLK is a signal that alternately goes logic-high and low at regular intervals and synchronizes operation of SAR logic circuit 100.

The CDAC operation indicates the periods during which sampling and hold operations illustrated in FIG. 5 are performed. The encircled numbers in the sampling operation periods indicate sampling operations 1 and 2. The encircled numbers in the hold operation periods indicate hold operations 1, 2, 3, and 4.

The comparison result signal is the signal output from the comparator 90, which has been described in conjunction with the comparator 90 in FIG. 2 and therefore description of the comparison result signal will be omitted.

The input signal Vin, successive approximation signal Vout, signals SW-vcm, SW-analog, Bit-0, Bit-1, Bit-2, Bit-3, EOC, and the digital signal D [3:0] (signals D3, D2, D1, and D0) have been described in conjunction with the SAR logic circuit 100 in FIGS. 2 and 5 and therefore the description of these signals will be omitted.

The amplitude voltage of the input signal Vin in FIG. 6 is in the range from the GND level (0 V) to the power supply level (3.3 V). The amplitude voltage of the successive approximation signal Vout is in the range of GND level (0 V) to power supply level (1.2 V) in FIG. 6.

In the period between times T02 and T03, the SAR logic circuit 100 performs sampling operation 1. The SAR logic circuit 100 outputs a logic-high SW-vcm signal and a logic-high SW-analog signal. As a result, the reference signal Vcm is connected to the common node through the switch circuit 30 regardless of the logics of signals Bit-0, Bit-1, Bit-2, and Bit-3. Also, the input signal Vin is connected to the capacitors 50a, 50b, 50c, 50d, and 50e by the switch circuits 60a, 60b, 60c, 60d, and 60e.

In the period between times T03 and T04, the SAR logic circuit 100 performs sampling operation 2. The SAR logic circuit 100 outputs data held in registers Reg0, Reg1, Reg2, and Reg3 as signals D0, D1, D2, and D3. The SAR logic circuit 100 also outputs a logic-high EOC signal.

In the period between times T04 and T05, the SAR logic circuit 100 performs hold operation 1. The SAR logic circuit 100 outputs a logic-low SW-vcm signal and a logic-low SW-analog signal. The SAR logic circuit 100 sets a bit signal {1000} composed of signals Bit-0, Bit-1, Bit-2, and Bit-3.

In the period between times T05 and T06, the SAR logic circuit 100 performs hold operation 2. The SAR logic circuit 100 stores in register Reg3 corresponding to the most significant bit D3 the logic of the comparison result signal output from the comparator 90 as a result of comparison between the voltage on the common node of the CDAC circuit 10, that is, the voltage of Vout, and the voltage of the reference signal Vcm.

Then, the SAR logic circuit 100 outputs a logic-high Bit-2 signal. Since the comparison result signal output from the comparator 90 is logic-high, the SAR logic circuit 100 outputs a Bit-3 signal having the logic opposite to the logic of the comparison result signal, namely a logic-low Bit-3 signal. That is, the SAR logic circuit 100 sets a bit signal {0100}.

In the period between times T06 and T07, the SAR logic circuit 100 performs hold operation 3. The SAR logic circuit 100 stores in register Reg2 corresponding to bit D2 the logic of the comparison result signal output from the comparator 90 as a result of comparison between the voltage on the common node of the CDAC circuit 10, that is, the voltage Vouts of the successive approximation signal Vout, and the voltage Vcms of the reference signal Vcm.

The SAR logic circuit 100 then outputs a logic-high Bit-1 signal and a Bit-2 signal having the logic opposite to the logic of the comparison result signal output from the comparator 90. Since the comparison result signal output form the comparator 90 is logic-low, the SAR logic circuit 100 outputs Bit-2 signal having the opposite logic, namely a logic-high Bit-2 signal. That is, the SAR logic circuit 100 sets a bit signal {0110}.

In the period between times T07 and T08, the SAR logic circuit 100 performs hold operation 4. The SAR logic circuit 100 stores in register Reg1 corresponding to bit D1 the logic of the comparison result signal output from the comparator 90 as a result of comparison between the voltage on the common node of the CDAC circuit 10, that is, the voltage Vouts of the successive approximation signal Vout, and the voltage Vcms of the reference signal Vcm.

The SAR logic circuit 100 then outputs a logic-high Bit-0 signal and a Bit-1 signal having the logic opposite to the logic of the comparison result signal output from the comparator 90. Since the comparison result signal output from the comparator 90 is logic-low, the SAR logic circuit 100 outputs a Bit-1 signal having the opposite logic, namely a logic-high Bit-1 signal. That is, the SAR logic circuit 100 sets a bit signal {0111}.

In the period between times T08 and T09, the SAR logic circuit 100 performs sampling operation 1. In order to preserve the result of hold operation 4, the SAR logic circuit 100 stores in register Reg0 the logic of the comparison result signal output from the comparator 90 as a result of comparison between the voltage on the common node of the CDAC circuit 10, that is, the voltage Vouts of the successive approximation signal Vout, and the voltage Vcms of the reference signal Vcm.

In the period between times T09 and T10, the SAR logic circuit 100 performs sampling operation 2. As a result, "0100" stored in registers Reg3 to Reg0 is output from the SAR logic circuit 100 as the bits (signals D0, D1, D2, and D3) of the digital signal D [3:0] at time T10.

The SAR logic circuit 100 repeats the operation performed in periods between times T02 and T08.

In summary, the digital-to-analog converter circuit 4 according to the first exemplary embodiment includes:

a capacitor array (capacitor array 40) including a plurality of first capacitors (capacitors 50a, 50b, 50c, 50d, and 50e), each having a first terminal connecting to a common node and having a capacitance represented by the nth power of 2 ($2^n$) (where n is a positive integer) on the basis of the smallest of the capacitances of the first capacitors=1;

a second capacitor (capacitor 70) connected to the common node and contributing to attenuation of the voltage on the common node;

a switch array including a plurality of first switches (60b2 in 60b, the second switch in 60c, the second switch in 60d, and the second switch in 60e), each supplying and disconnecting one of a first reference voltage (high-voltage VRHS), a second reference voltage (low-voltage VRLS), and the voltage (Vins) of an input signal to and from a second terminal of an associated one of the first capacitors;

a second switch (switch 30) connected to the common node and supplying and disconnecting a third reference voltage (Vcms) to and from the common node;

a comparator (comparator 90) comparing a voltage (Vouts) on the common node with the third reference voltage; and a control circuit controlling the supply and disconnection by the first switches and the supply and disconnection by the second switch.

The control circuit controls the first and second switches so that the supply of the voltage of the input signal by the first switches and the supply of the third reference voltage by the second switch take place at the same time.

The control circuit controls the second switch to disconnect the third reference voltage from the common node when the first switches supply the first or second reference voltage to the first capacitors.

Furthermore, the control circuit selects first switches that supply the first reference voltage and first switches that supply the second reference voltage from among the plurality of first switches on the basis of the logic of the signal output from the comparator.

Here, let the total capacitance of the capacitor array be equal to the smallest of the capacitances of the first capacitors times B and the total capacitance of the first capacitors to which the first reference voltage is being supplied be equal to the smallest capacitance times A. The control circuit determines whether the value of $(B \cdot Vins - A \cdot Vrhs - (B-A) \cdot Vrls)$ is positive or negative, selects first capacitors to be supplied with the first reference voltage so that the value of $(B \cdot Vins - A \cdot Vrhs - (B-A) \cdot Vrls)$ approaches 0, and outputs a digital signal that is a binary expression of the value of A that minimizes (B·Vins−A·Vrhs−(B−A)·Vrls).

Also, the control circuit determines on the basis of the logic of the signal output from the comparator whether the value of (B·Vins−A·Vrhs−(B−A) ·Vrls) is positive or negative, performs control to select first switches which supply the first reference voltage so that the value of (B·Vins−A·Vrhs−(B−A) ·Vrls) approaches 0, and outputs a digital signal that is a binary expression of the value of A that minimizes (B·Vins−A·Vrhs−(B−A)·Vrls).

In the analog-to-digital converter circuit 4 described above, the maximum voltage applied to the common node is decreased by the contribution of the second capacitor (capacitor 70). Therefore, the required withstand voltage of the MOS transistors of the comparator 90 which receives the analog voltage from the common node and compares that analog voltage with the reference voltage is reduced blow the maximum voltage of the signal amplitude of the analog input signal Vin.

This reduction makes it possible to apply miniaturization technology, which entails reduction of driving voltage, to the MOS transistors of the comparator (comparator 90) which receives a signal on the common node and MOS capacitances to reduce the sizes of the gate electrodes and source/drain regions of the MOS transistors and the thickness of gate insulating films. Furthermore, the maximum voltage applied across the multiple capacitors (such as capacitor 50a) of the capacitor array (capacitor array 40) also decreases. Consequently, the thickness of gate insulting films of MOS capacitances and the size of electrodes of the MOS capacitances is reduced.

Accordingly, the chip areas occupied by the MOS transistors and MOS capacitances of the analog-to-digital converter circuit 4 are reduced.

The analog-to-digital converter circuit 4 of the first exemplary embodiment may be used in an RF receiver 1. The RF receiver 1 includes a filter circuit which reduces noise in a received signal, an amplifier 3 which amplifies the noise-reduced received signal, the above-described analog-to-digital converter circuit 4 which converts the received signal to a digital signal, and a DSP demodulator which recovers the original unmodulated signal from the noise-reduced received signal.

In this configuration, the analog-to-digital converter circuit 4 occupies a smaller area on the semiconductor substrate of the SOC having the function of the RF receiver 1. Since the analog-to-digital converter circuit 4 itself attenuates the analog voltage of the input signal, the need for providing an attenuator that attenuates signal voltage between the analog-to-digital converter circuit 4 and the DSP demodulator is eliminated. Consequently, the chip area of the entire SOC is reduced.

Since the attenuation of the analog voltage of the input signal is accomplished by changing the distribution of charge on the common node by the capacitance, a noise component of the analog voltage attenuates at the same rate at the same time. Accordingly, even though the analog amplitude of the input signal attenuates, an appropriate signal-to-noise ratio between the actual signal and nose is maintained.

In the analog-to-digital converter circuit 4 of the first exemplary embodiment, the capacitor 70 of the CDAC circuit 10 that is used for attenuation of the voltage on the common node is connected to the common node. However, a capacitor used for attenuation of the voltage Vins of the input signal Vin may be provided between and connected to the input terminal and the switches 60a, 60b, 60c, 60d, and 60e to attenuate the voltage on the common node. An example will be given as a second exemplary embodiment.

Second Exemplary Embodiment

Figure 7:
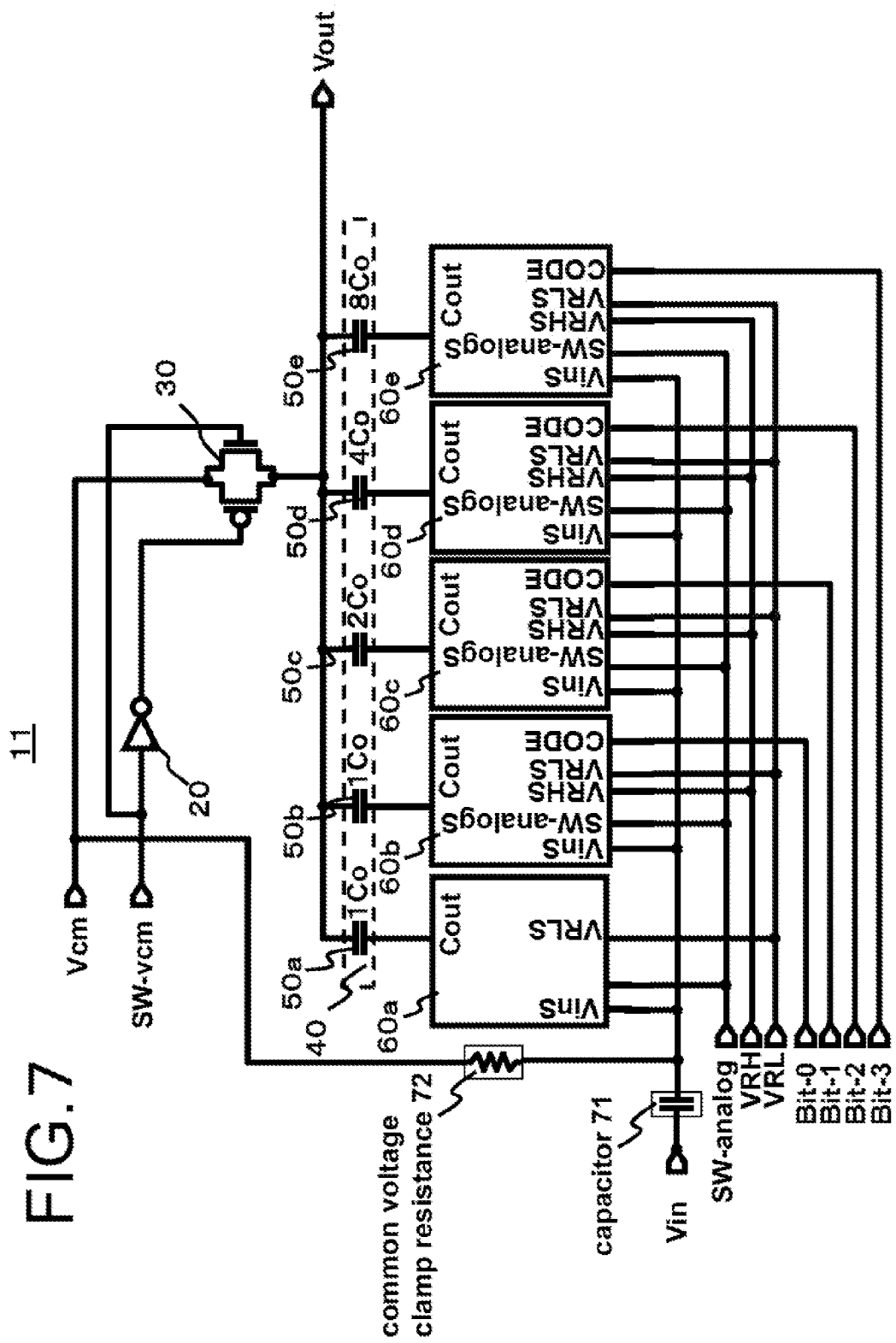
FIG. 7 illustrates a CDAC circuit 11 in a variation of the analog-to-digital converter circuit 4 according to a second exemplary embodiment.

FIG. 7 illustrates a CDAC circuit 11 of a variation of the analog-to-digital converter circuit 4 according to the second exemplary embodiment. The variation has a CDAC circuit 11 in place of the CDAC circuit 10 in the analog-to-digital converter circuit 4 according to the first exemplary embodiment. The CDAC circuit 11 includes an inverter circuit 20 which outputs an inverted signal, a switch circuit 30, a capacitor array 40 including capacitors 50a, 50b, 50c, 50d, and 50e connected to the common node, switches 60a, 60b, 60c, 60d, and 60e associated with the capacitors 50a, 50b, 50c, 50d, and 50d, a capacitor 71, and a common voltage clamp resistance 72.

Components in the CDAC circuit 11 of the analog-to-digital converter circuit of the second exemplary embodiment that are labeled the same reference numerals as the inverter circuit 20 outputting an inverted signal, the switch circuit 30, the capacitor array 40 including the capacitors 50a, 50b, 50c, 50d, and 50e, and the switch circuits 60a, 60b, 60c, 60d, and 60e associated with the capacitors 50a, 50b, 50c, 50d, and 50d in the CDAC circuit 10 of the analog-to-digital converter circuit of the first exemplary embodiment are the same as those components and therefore the description of the components will be omitted.

The capacitor 71 is connected to Vins terminal of each of the switches 60a, 60b, 60c, 60d, and 60e and to an input terminal Vin. An input signal Vin propagates to the Vin terminals of the switches 60a, 60b, 60c, 60d, and 60e through the capacitor 71. The capacitance of the capacitor 71 is denoted by C2.

One of the terminals of the common voltage clamp resistance 72 is connected to the capacitor 71 and to the switches 60a, 60b, 60c, 60d, and 60e and the other terminal is connected to a reference signal Vcm.

The variation of the analog-to-digital converter circuit 4 includes an SAR logic circuit 100 and a comparator 90 similar to those of the analog-to-digital converter circuit 4 of the first exemplary embodiment.

Accordingly, the SAR logic circuit 100 and the comparator 90 in the variation of the analog-to-digital converter circuit 4 operate similarly to those in the first exemplary embodiment.

However, charge Q4 stored on the common node of the CDAC circuit 11 in sampling operation 1 of the SAR logic circuit 100 is:

$$Q4 = B \times C0 \times C2 \times (Vcms - Vins)/(B \times C0 + C2) \quad \text{Equation (4)}$$

In hold operations 1 through 4 of the SAR logic circuit 100, the following charge Q5 is stored on the common node:

$$Q5 = (Vouts - Vrhs) \times A \times C0 + (B - A)(Vouts - Vrls) \times C0 \quad \text{Equation (5)}$$

where B is the total capacitance of the capacitors in the capacitor arrays 40 divided by C0 and A is the total capacitance of capacitors in the capacitor array 40 to which a high-voltage signal VRH is being applied divided by C0.

From Equations (4) and (5) it follows that $$Vouts = C2 \times (Vcms - Vins)/(B \times C0 + C2) + A \times Vrhs/B + (B-A) \times Vrls/B \quad \text{Equation (6)}$$

From Equation (6), the amplitude voltage Vins of the input signal Vin is attenuated by the voltage attenuating capacitor 71 to $C2/(B \times C0 + C2)$. Thus, the capacitor 71 contributes to attenuation of the voltage on the common node, that is, the voltage Vouts of the successive approximation signal Vout.

In the second exemplary embodiment, the voltage of the reference signal input into the other terminal of the comparator 90 (the terminal into which the successive approximation signal Vouts is not input) is C2×Vcms/(B×C0+C2). As in the first exemplary embodiment, the SAR logic circuit 100 in the second exemplary embodiment controls combination of logics of signals Bit-0, Bit-1, Bit-2, and Bit-3 so as to cause the CDAC circuit 11 to provide asymptotic behavior. Specifically, the SAR logic circuit 100 determines whether the value of (C2·Vins/(BC0+C2)−A·Vrhs/B−(B−A)·Vrls/B) is positive or negative and selects capacitors from among the capacitors in the capacitor array 40 to be supplied with a high-voltage signal VRH so that the value of (C2·Vins/(BC0+C2)−A·Vrhs/B−(B−A)·Vrls/B) approaches 0, and outputs a digital signal that is a binary expression of the value A that minimizes (C2·Vins/(BC0+C2)−A·Vrhs/B−(B−A)·Vrls/B).

In summary, the variation of the digital-to-analog converter circuit 4 according to the second exemplary embodiment includes:

a capacitor array (capacitor array 40) including a plurality of first capacitors (capacitors 50*a*, 50*b*, 50*c*, 50*d*, and 50*e*), each having a first terminal connecting to a common node and having a capacitance represented by the nth power of 2 ($2^n$) (where n is a positive integer) on the basis of the smallest of the capacitances of the first capacitors=1;

a switch array including a plurality of first switches (60*b*2 in 60*b*, the second switch in 60*c*, the second switch in 60*d*, and the second switch in 60*e*) supplying and disconnecting a first reference voltage (high-voltage VRHS) or a second reference voltage (low-voltage VRLS) to and from a second terminal of each of the first capacitors;

a second switch (switch 30) connected to the common node and supplying and disconnecting a third reference voltage (Vcms) to and from the common node;

a second capacitor (capacitor 71) connected to an input signal in series and contributing to attenuation of the input signal;

third switches (60*b*1 in 60*b*, the first switch in 60*c*, the first switch in 60*d*, and the first switch in 60*e*), each electrically connecting and disconnecting the second capacitor to and from the second terminal of each of the first capacitors;

a comparator (comparator 90) comparing the voltage (Vouts) on the common node with a fourth reference voltage (which is equal to Vcms times an attenuation rate); and a control circuit controlling the supply and disconnection by the first switches, the supply and disconnection by the second switch, and the connection or disconnection of the third switches.

The control circuit controls the second and third switches so that the connection of the second capacitor by the third switches and the supply of the third reference voltage by the second switch take place at the same time.

The control circuit controls the first and second switches so that the second switch disconnects the third reference voltage from the common node when any of the first switches supply the first or second reference voltage to the associated first capacitors.

The control circuit controls selection of first capacitors from among the first capacitors to be supplied with the first reference voltage and selection of first capacitors from among the first capacitors to be supplied with the second reference voltage.

Here, let the total capacitance of the capacitor array equal the smallest of the capacitances of the first capacitors times B and the total capacitance of the first capacitors to which the first reference voltage is being supplied equal the smallest capacitance times A. The control circuit determines on the basis of the logic of the signal output from the comparator 90 whether the value of (C2·Vins/(BC0+C2)−A·Vrhs/B−(B−A)·Vrls/B) is positive or negative, selects first switches to supply the first reference voltage so that the value of (C2·Vins/(BC0+C2)−A·Vrhs/B−(B−A)·Vrls/B) approaches 0, and outputs a digital signal that is a binary expression of the value of A that minimizes (C2·Vins/(BC0+C2)−A·Vrhs/B−(B−A)·Vrls/B).

Therefore, the variation of the analog-to-digital converter circuit 4 has the same advantageous effects as the analog-to-digital converter circuit 4 of the first exemplary embodiment.

The above-described variation of the analog-to-digital converter circuit 4 of the first exemplary embodiment may be used in an RF receiver 1. The RF receiver 1 includes a filter circuit which reduces noise in a received signal, an amplifier 3 which amplifies the noise-reduced received signal, the above-described variation of the analog-to-digital converter circuit 4 which converts the received signal to a digital signal, and a DSP demodulator which recovers the original unmodulated signal from the noise-reduced received signal.

The SOC including the function of the RF receiver 1 using the variation has the same advantageous effects as the SOS using the analog-to-digital converter circuit 4 of the first exemplary embodiment.

The capacitor 70 of the CDAC circuit 10 that is used for attenuating the voltage on the common node is connected to the common node in the analog-to-digital converter circuit 4 of the first exemplary embodiment. However, as in the variation according to the second exemplary embodiment, the capacitor 71 used for attenuating the voltage Vins of the input signal Vin may be provided between and connected to the input terminal and the switches 60*a*, 60*b*, 60*c*, 60*d*, and 60*e* to attenuate the voltage on the common node. Limitations on the frequency of an input signal may be reduced as well by passing the input signal through the capacitor used for attenuation of the voltage on the common node. An example will be given as a third exemplary embodiment.

Third Exemplary Embodiment

Figure 8:
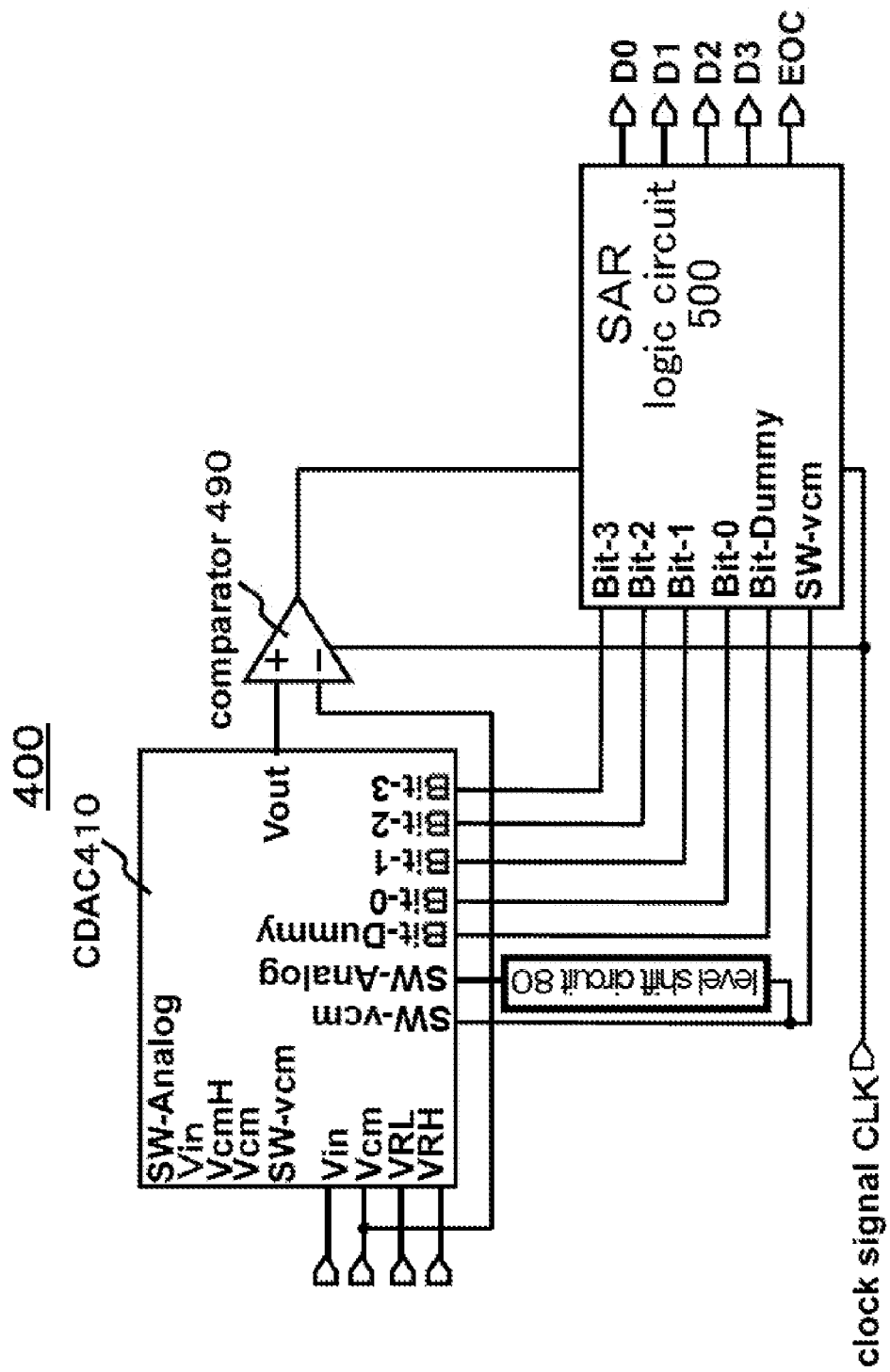
FIG. 8 illustrates an analog-to-digital converter circuit 400 according to a third exemplary embodiment.

FIG. 8 illustrates an analog-to-digital converter circuit 400 according to the third exemplary embodiment. The analog-to-digital converter circuit 400 includes a CDAC circuit 410, a comparator 490, a level shift circuit 480, and an SAR logic circuit 500.

The level shift circuit 480 and the comparator 490 are the same as the level shift circuit 80*a* and the comparator 90 of the first exemplary embodiment and therefore description of these components will be omitted.

The CDAC circuit 410 will be described later with reference to FIG. 9.

The SAR logic circuit 500 controls the CDAC circuit 410 in synchronization with an input clock signal to generate a successive approximation signal Vout based on an input signal Vin sampled by the CDAC circuit 410 and controls the CDAC circuit 410 to store the comparison voltage of the successive approximation signal Vout.

In order to control the CDAC circuit 410, the SAR logic circuit 500 outputs signals Bit-0, Bit-1, Bit-2, Bit-3, Bit-Dummy, SW-analog, and Sw-vcm to the CDAC circuit 410.

The SAR logic circuit 500 determines the bits of a digital signal D [3:0] corresponding to the analog voltage of the sampled input signal Vin on the basis of the logic of a successive comparison result signal output from the comparator 490 supplied with the successive approximation signal Vout, and outputs logic signals (signals D3, D2, D1, and D0) corresponding to the bits and a signal EOC indicating the end of conversion. Control of the ODAC circuit 410 performed by the SAR logic circuit 500 and the determination of the digital signal made by the SAR logic circuit 500 will be described later with reference to FIGS. 10 and 11.

Figure 9:
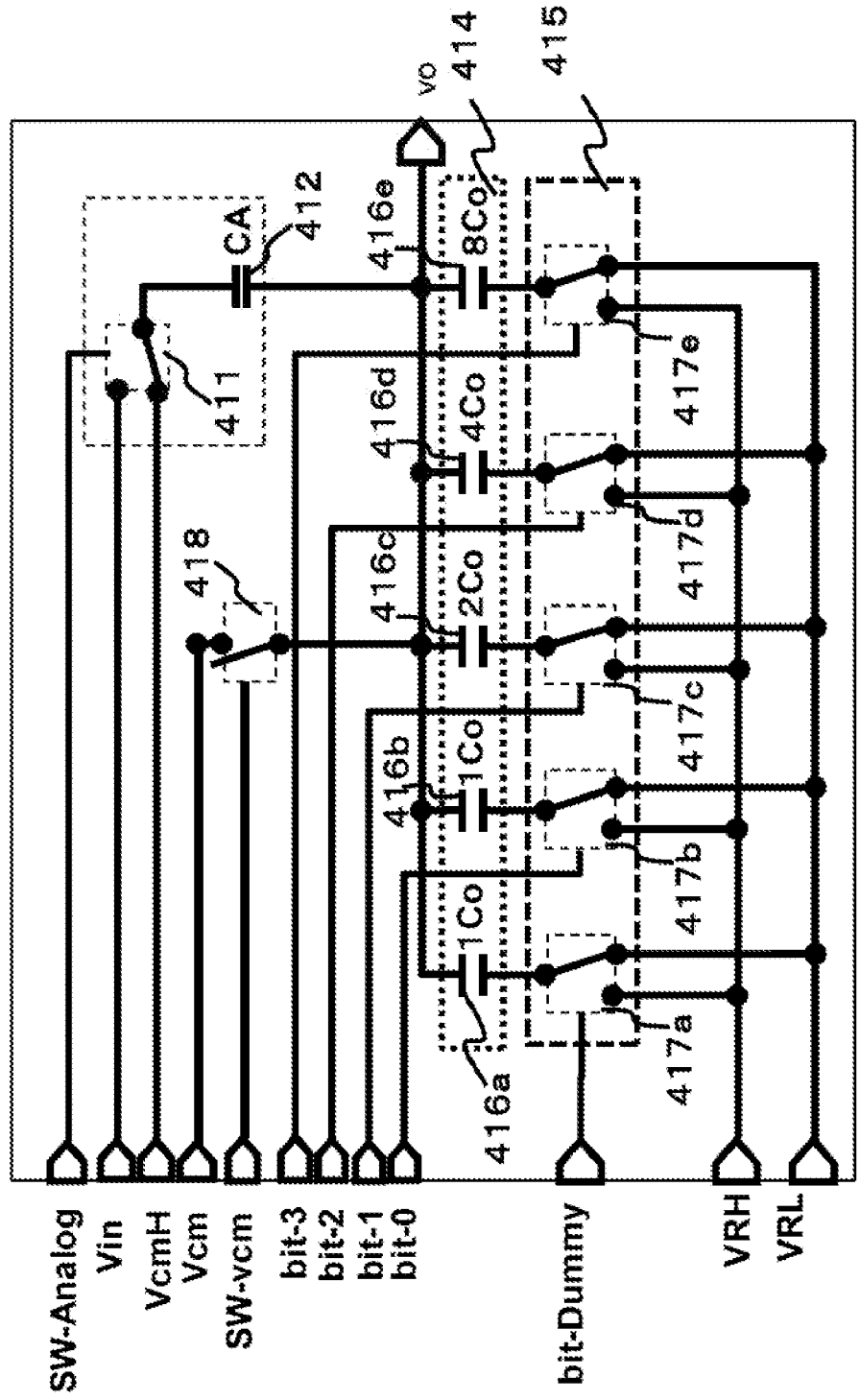
FIG. 9 illustrates a CDAC circuit 410 according to the third exemplary embodiment.

FIG. 9 illustrates the CDAC circuit 410 of the third exemplary embodiment. The CDAC circuit 410 includes a switch 411, a capacitor 412, a capacitor array 414, a switch array 415, and a switch 418.

One of the electrodes of the capacitor 412 is connected to a common node of the capacitor array 414.

The other electrode of the capacitor 412 is connected to one of the terminals of the switch 411. The other two terminals of the switch 411 connect to a reference signal Vcmh and the input signal Vin. The switch 411 receives the SW-analog signal output from the SAR logic circuit 500 and supplies either the reference signal Vcmh or the input signal Vin to the electrode of the capacitor 412 connected to the switch 411 according to the logic of the SW-analog signal.

The switch 418 receives the SW-vcm signal and connects or disconnects a reference signal Vcm having a reference voltage to and from the common node of the capacitor array 40 according to the logic of SW-Vcm signal.

The capacitor array 414 includes multiple capacitors 416a, 416b, 416c, 416d, and 416e.

One of the electrodes of each of the capacitors 416a, 416b, 416c, 416d, and 416e is connected to the common node. On the basis of the smallest of the capacitances of the capacitors 416a, 416b, 416c, 416d, and 416e=1. The other capacitors have capacitances that are represented by $2^n$ (where n is a positive integer). That is, the capacitor array 416 includes capacitors having binary-weighted capacitance values. Specifically, if the capacitance of capacitor 416a is 1×Co (where Co is a positive constant), the capacitance of capacitor 416b is 1×Co, the capacitance of capacitor 416c is 2×Co, the capacitance of capacitor 416d is 4×Co, and the capacitance of capacitor 416e is 8×Co.

The common node is connected to the terminal through which a successive approximation signal Vout is output and the voltage on the common node is equal to the voltage of the successive approximation signal Vout.

The switch array 415 includes switches 417a, 417b, 417c, 417d, and 417e. One of the terminals of each of the switches 417a, 417b, 417c, 417d, and 417e is connected to the other terminal (the terminal that is not connected to the common node) of associated one of the capacitors 416a, 416b, 416c, 416d, and 416e.

The other two terminals of each of the switches 417a, 417b, 417c, 417d, and 417e connect to reference signals VRH and VRL. The switches 417a, 417b, 417c, 417d, and 417e supply one of the reference signals VRH and VRL to the other electrode of their associated capacitors 416a, 416b, 416c, 416d, and 416e according to the logics of signals Bit-Dummy, Bit-0, Bit-1, Bit-2, Bit-3, respectively.

The voltages of the reference signals VRH and VRL are lower than the withstand voltage of low-voltage MOS transistors. Such low voltages sufficiently work because the voltage comparison performance of the comparator 490 has been improved by miniaturizing the MOS transistors of the comparator 490 using miniaturization technology.

The switches 417a, 417b, 417c, 417d, and 417e may also be formed by low-voltage MOS transistors reduced in size by using miniaturization technology. The size reduction enables the voltage amplitude of signals Bit-Dummy, Bit-0, Bit-1, Bit-2, and Bit-3 for controlling the supply and disconnection by the switches 417a, 417b, 417c, 417d, and 417e to be reduced to a value lower than or equal to the withstand voltage of low-voltage MOS transistors. In addition, the SAR logic circuit 500 which outputs signals Bit-Dummy, Bit-0, Bit-1, Bit-2, and Bit-3 may be directly connected to the switches 417a, 417b, 417c, 417d, and 417e without passing through a level shift circuit.

However, the switch 411, which supplies and disconnects the input signal Vin, needs to be formed by a MOS transistor capable of withstanding the maximum voltage of the voltage amplitude of the input signal Vin. A voltage approximately the same as the maximum voltage of the input signal Vin needs to be applied to the gate electrode of the MOS transistor constituting the switch 411. Therefore, the amplitude voltage of the SW-analog signal output from the SAR logic circuit 500 needs to be increased by passing through the level shifter 480 as illustrated in FIG. 8.

The SAR logic circuit 500 and the comparator 490 in the analog-to-digital converter circuit 400 in FIG. 8 operate similarly to the SAR logic circuit 100 and the comparator 90 of the analog-to-digital converter circuit 4 of the first exemplary embodiment to control the CDAC circuit 410. However, since the configuration of the CDAC circuit 410 differs from that of the CDAC circuit 10, the signals that the SAR logic circuit 500 outputs and the logics of the signals differ from those of the SAR logic circuit 100. Operation of the SAR logic circuit 500 will be detailed later with respect to FIGS. 10 and 11.

Charge Q7 stored on the common node of the CDAC circuit 410 during sampling operation 1 by the SAR logic circuit 500 is $$Q7 = C3 \times (Vcms - Vins) + B \times C0 \times (Vcms - Vrhs)/2 + B \times C0 \times (Vcms - Vrls)/2 \quad \text{Equation (7)}$$

where C3 is the capacitance of the capacitor 412 and B is the total capacitance of the capacitors in the capacitor array 414 divided by C0.

Charge Q8 stored on the common node during hold operations 1 through 4 by the SAR logic circuit 500 is $$Q8 = (Vouts - Vrhs) \times A \times C0 + (B-A)(Vouts - Vrls) \times C0 + (Vouts - Vcmhs) \times C3 \quad \text{Equation (8)}$$

where A is the total capacitance of the capacitors among the capacitors in the capacitor array 414 to which the high-voltage signal VRH is being applied divided by C0 and Vcmhs is the voltage of the reference signal Vcmh.

Since charge Q7 is equal to charge Q8, from Equations (7) and (8) it follows that:

$$Vouts = Vcms - C3 \times (Vins - Vcmhs)/(B \times C0 + C3) + (A - B/2) \times C0 \times (Vrhs - Vrls)/(B \times C0 + C3) \quad \text{Equation (9)}$$

From Equation (9), the amplitude voltage Vins of the input signal Vin is attenuated to C3/(B×C0+C3) by the voltage attenuating capacitor 412. Thus, the capacitor 412 contributes to attenuation of the voltage Vouts of the successive approximation signal Vout.

The voltage of the reference signal input in the other terminal of the comparator 490 (the terminal to which the successive approximation signal Vouts is not input) is Vcms in the third exemplary embodiment.

Figure 10:
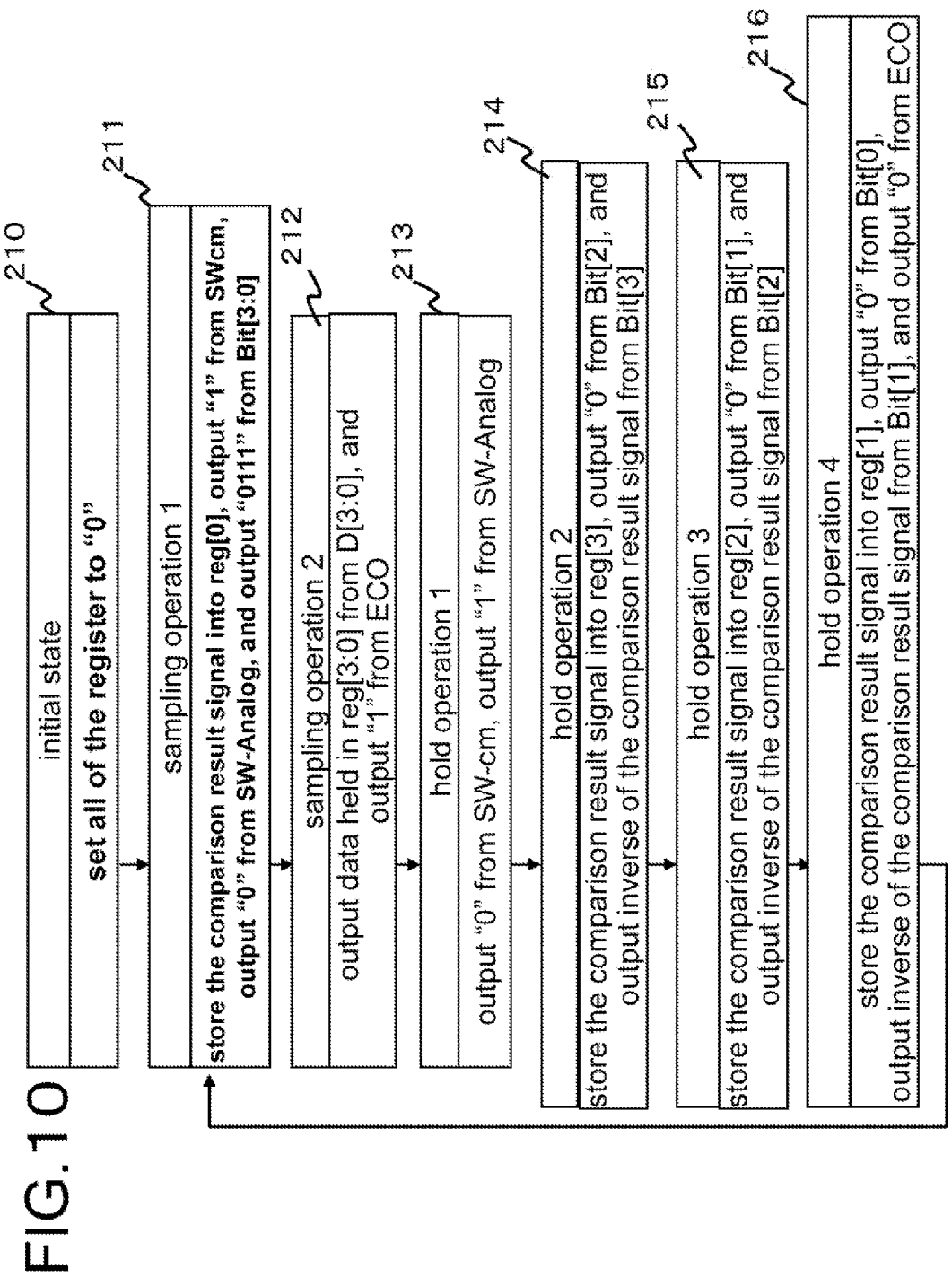
FIG. 10 is a flowchart illustrating control operation by an SAR logic circuit 500.

FIG. 10 is a flowchart illustrating control operation by the SAR logic circuit 500.

In the initial state 210, the SAR logic circuit 500 resets four registers Reg0, Reg1, Reg2, and Reg3 which hold the bits of a digital signal corresponding to the input signal Vin having an analog voltage.

In sampling operation 1 (211), the SAR logic circuit 500 stores in register Reg0 the logic of a comparison result signal output from the comparator 490 as a result of comparison between the voltage Vouts of the successive approximation signal Vout from the CDAC circuit 410 and the voltage Vcms of the reference signal Vcm in order to preserve the result of hold operation 4. The SAR logic circuit 500 then outputs a logic-high SW-vcm signal and a logic-low SW-analog signal. Furthermore, the SAR logic circuit 500 outputs a logic-high Bit-0 signal, logic-high Bit-1 signal, logic-high Bit-2 signal, and logic-low Bit-3 signal. This state is referred to herein as "setting a bit signal {0111}". The digits in { } represent the logics of bit signals Bit-3, Bit-2, Bit-1, and Bit-0, from left to right. The SAR logic circuit 500 also outputs logic-high Bit-Dummy signal.

The reference signal Vcm is coupled onto the common node through the switch circuit 418. The input signal Vin is connected to the capacitor 412 by the switch 411.

On the other hand, capacitor 416e is connected to the reference voltage VRH and the other capacitors 416a, 416b, 416c, and 416d are connected to the reference voltage VRL. As a result, charge Q7 expressed by Equation (7) is stored on the common node of the CDAC circuit 410.

In sampling operation 2 (212), the SAR logic circuit 500 outputs data held in registers Reg0, Reg1, Reg2, and Reg3 as signals D0, D1, D2, and D3. The SAR logic circuit 500 also outputs a logic-high EOC signal.

In hold operation 1 (213), the SAR logic circuit 500 outputs a logic-low SW-vcm signal and a logic-high SW-analog signal. As a result, the reference signal Vcm is disconnected from the common node. The input signal Vin is disconnected from the capacitor 412 and the reference voltage Vcmh is connected to the capacitor 412 by the switch 411.

The logics of signals Bit-0, Bit-1, Bit-2, and Bit-3 output from the SAR logic circuit 500 are retained. That is, the bit signal {0111} is retained. The SAR logic circuit 500 outputs logic-high Bit-Dummy signal.

As a result, the charge Q8 expressed by Equation (8) is stored on the common node. The voltage on the common node, that is, the voltage Vouts of the successive approximation signal Vout is expressed by Equation (9).

In hold operation 2 (214), the SAR logic circuit 500 stores in register Reg3 corresponding to the most significant bit D3 the logic of a comparison result signal output from the comparator 490 as a result of comparison between the voltage on the common node of the CDAC circuit 410, that is, the voltage of Vout, and the voltage of the reference signal Vcm. The SAR logic circuit 500 outputs logic-high Bit-Dummy signal.

The SAR logic circuit 500 then outputs a logic-low Bit-2 signal and also outputs Bit-3 signal having the same logic as the comparison result signal output from the comparator 490.

Consequently, after hold operation 1, if the voltage on the common node is higher than Vcms, a bit signal {1011} is set in hold operation 2. If the voltage on the common node is lower than Vcms, a bit signal {0011} is set in hold operation 2.

Consequently, if the bit signal {1100} is set, the value of A in Equation (9) will be 12; if the bit signal {0100} is set, the value of A will be 4.

After hold operation 2, the voltage on the common node of the CDAC circuit 410 is compared with the voltage Vcms of the reference signal Vcm. If the voltage on the common node is higher, the comparator 490 outputs a logic-low comparison result signal and signal D2 representing the third bit of the digital signal becomes logic-low. On the other hand, if the voltage on the common node is lower, the comparator 490 outputs a logic-high comparison result signal and signal D2 representing the third bit of the digital signal becomes logic-high. In hold operation 3 (215), the SAR logic circuit 500 stores in register Reg2 corresponding to bit D2 the logic of the comparison result signal output from the comparator 490 as a result of comparison between the voltage on the common node of the CDAC circuit 410, that is, the voltage Vouts of the successive approximation signal Vout, and the voltage Vcms of the reference signal Vcm. The SAR logic circuit 500 outputs a logic-high Bit-Dummy signal.

The SAR logic circuit 500 then outputs a logic-high Bit-1 signal and Bit-2 signal having the logic opposite to the logic of the comparison result signal output from the comparator 490.

Consequently, after hold operation 2, if the voltage on the common node (successive approximation signal voltage Vouts) is higher than Vcms, a bit signal {X001} is set in hold operation 3. If the voltage on the common node is lower than Vcms, a bit signal {X101} is set in hold operation 3. Here, X is 1 or 0.

Consequently, if the bit signals {1001} and {1101} are set, the value of A in Equation (9) will be 6 and 2, respectively. If the bit signals {1101} and {0101} are set, the value of A will be 14 and 10, respectively.

After hold operation 3 (215), the voltage on the common node of the CDAC circuit 410 is compared with the voltage Vcms of the reference signal Vcm. If the voltage on the common node is higher, the comparator 490 outputs a logic-low comparison result signal and signal D1 representing the second bit of the digital signal becomes logic-low. On the other hand, if the voltage on the common node is lower, the comparator 490 outputs a logic-high comparison result signal and signal D1 representing the second bit of the digital signal becomes logic-high.

In hold operation 4 (216), the SAR logic circuit 500 stores in register Reg1 corresponding to bit D1 the comparison result signal output from the comparator 490 as a result of comparison between the voltage on the common node of the CDAC circuit 410, that is, the voltage Vouts of the successive approximation signal Vout, and the voltage Vcms of the reference signal Vcm. The SAR logic circuit 500 outputs logic-high Bit-Dummy signal.

The SAR logic circuit 500 then outputs a logic-low Bit-0 signal and signal Bit-1 having the logic opposite to that of the comparison result signal from the comparator 490. Consequently, after hold operation 3, if the voltage on the common node is higher than Vcms, a bit signal {XX10} is set in hold operation 4; if the voltage on the common node is lower than Vcms, a bit signal {XX00} is set in hold operation 3. Here, X is 1 or 0.

Consequently, if bit signal {0010}, {0110}, {1010}, and {1110} are set, the value of A in Equation (9) will be 13, 9, 5, and 1, respectively. If bit signals {0100}, {1000}, and {1100} are set, the value of A will be 15, 11, 7, and 3, respectively.

After hold operation 4, the voltage on the common node of the CDAC circuit 410 is compared with the voltage Vcms of the reference signal Vcm. If the voltage on the common node is higher, the comparator 490 outputs a logic-low comparison result signal and signal D0 representing the least significant bit of the digital signal becomes logic-low. On the other hand, if the voltage on the common node is lower, the comparator 490 outputs a logic-high comparison result signal and signal D0 representing the least significant bit of the digital signal becomes logic-high.

In summary, the SAR logic circuit 500 controls combination of the logics of signals Bit-0, Bit-1, Bit-2, and Bit-3 so as to cause the CDAC circuit 410 to provide asymptotic behavior. Since the voltage of the reference signal input in the other terminal of the comparator 490 (the terminal in which the successive approximation signal Vouts is not input) is Vcms, the SAR logic circuit 500 determine whether the value of (C3×(Vins−Vcmhs)−(A−B/2)×C0×(Vrhs−Vrls)) is positive or negative, selects capacitors in the capacitor array 414 to which the high-voltage signal VRH is to be supplied so that the value of $(C3\times(Vins-Vcmhs)-(A-B/2)\times C0\times(Vrhs-Vrls))$ approaches 0, and outputs a digital signal that is a binary expression of A that minimizes $(C3\times(Vins-Vcmhs)-(A-B/2)\times C0\times(Vrhs-Vrls))$.

Figure 11:
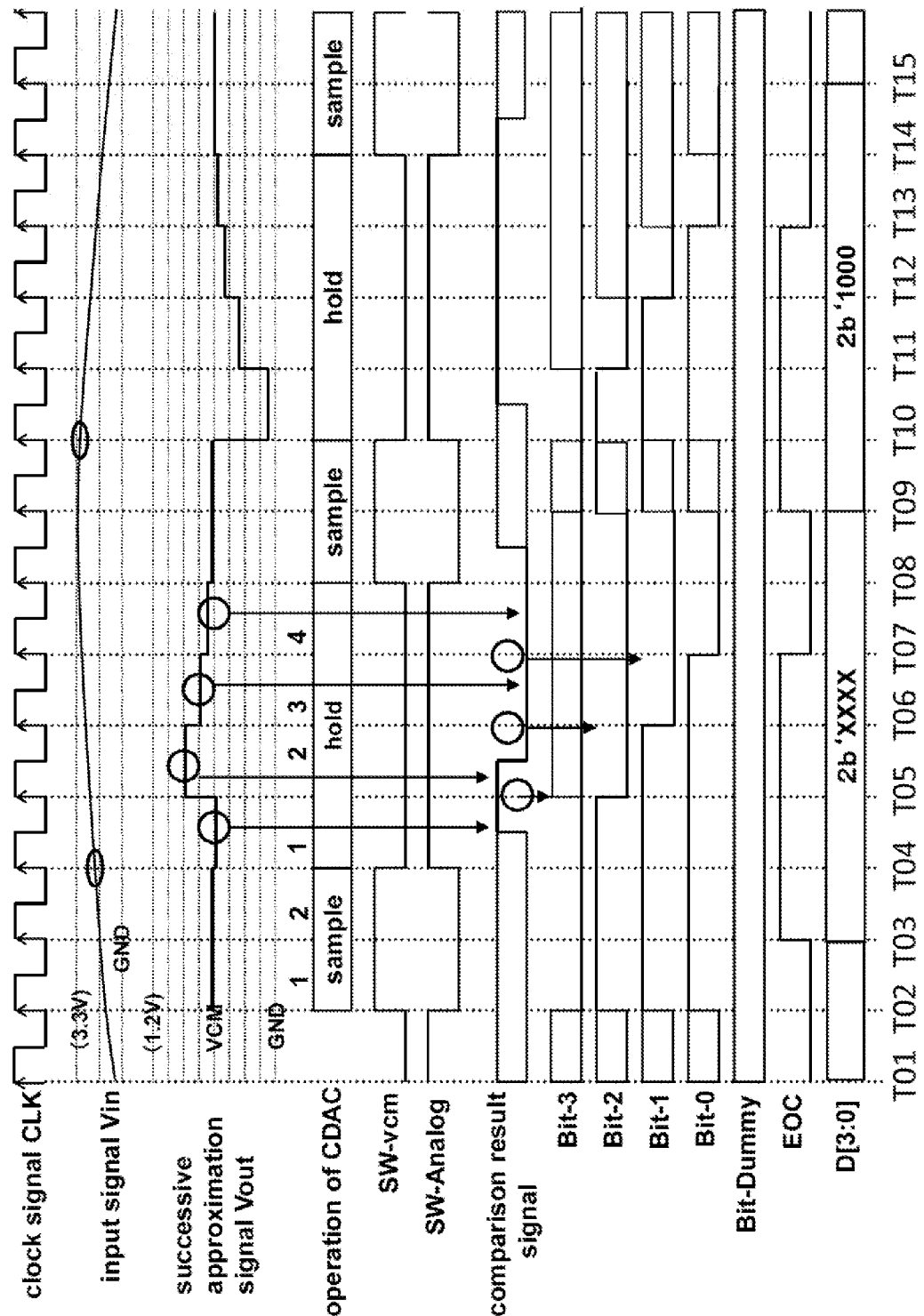
FIG. 11 is a timing chart illustrating operation of the SAR logic circuit 500.

FIG. 11 is a timing chart illustrating operation of the SAR logic circuit 500. FIG. 11 illustrates the clock signal, input signal Vin, successive approximation signal Vout, signals SW-vcm, SW-analog, comparison result signal, signals Bit-0, Bit-1, Bit-2, Bit-3, and EOC, and digital signal D [3:0] (signals D3, D2, D1, and D0), as well as CDAC operation.

The clock signal is a signal that alternately goes high and low at regular intervals and synchronizes operation of SAR logic circuit 500.

CDAC operation indicates the periods during which the sampling and hold operations illustrated in FIG. 10 are performed. The encircled numbers in the sampling periods indicate sampling operations 1 and 2. The encircled numbers in the hold operation periods indicate hold operations 1, 2, 3, and 4.

The comparison result signal is the signal output from the comparator 490.

The input signal Vin, successive approximation signal Vout, signals SW-vcm, SW-analog, Bit-3, Bit-2, Bit-1, Bit-0, Bit-Dummy, EOC, and the digital signal D [3:0] (signals D3, D2, D1, and D0) have been described in conjunction with the SAR logic circuit 500 with reference to FIGS. 8 and 10 and therefore the description of these signals will be omitted.

The amplitude voltage of the input signal Vin is in the range from GND level (0 V) to power supply level (3.3 V) in FIG. 11. The amplitude voltage of the successive approximation signal Vout is in the range from GND level (0 V) to power supply level (1.2 V) in FIG. 11.

In the period between times T02 and T03, the SAR logic circuit 500 performs sampling operation 1. The SAR logic circuit 500 outputs a logic-high SW-vcm signal and a logic-low SW-analog signal. The logics of signals Bit-3, Bit-2, Bit-1, and Bit-0 are set as a bit signal {0111}. The Bit-Dummy signal is logic-high.

In the period between times T03 and T04, the SAR logic circuit 500 performs sampling operation 2. The SAR logic circuit 500 outputs data held in registers Reg0, Reg1, Reg2 and Reg3 as signals D0, D1, D2, and D3, respectively. The SAR logic circuit 500 also outputs a logic-high EOC signal.

In the period between times T04 and T05, the SAR logic circuit 500 performs hold operation 1. The SAR logic circuit 100 outputs a logic-low SW-vcm signal and a logic-high SW-analog signal.

In the period between times T05 and T06, the SAR logic circuit 500 performs hold operation 2. The SAR logic circuit 500 stores in register Reg3 corresponding to the most significant bit D3 the logic of the comparison result signal output from the comparator 490 as a result of comparison between the voltage on the common node of the CDAC circuit 410, that is, the voltage of Vout, and the voltage of the reference signal Vcm.

The SAR logic circuit 500 then outputs a logic-low Bit-2 signal. Since the comparator 490 outputs a logic-high comparison result signal, the SAR logic circuit 500 outputs a logic-high Bit-3 signal. That is, the SAR logic circuit 500 sets a bit signal {1011}.

In the period between times T06 and T07, the SAR logic circuit 500 performs hold operation 3. The SAR logic circuit 500 stores in register Reg2 corresponding to bit D2 the logic of the comparison result signal output from the comparator 490 as a result of comparison between the voltage on the common node of the CDAC circuit 410, that is, the voltage Vouts of the successive approximation signal Vout, and the voltage Vcms of the reference signal Vcm.

The SAR logic circuit 500 then outputs a logic-low Bit-1 signal. Since the comparator 490 outputs a logic-low comparison result signal, the SAR logic circuit 500 outputs a logic-low Bit-2 signal. That is, the SAR logic circuit 500 sets a bit signal {1001}.

In the period between times T07 and T08, the SAR logic circuit 500 performs hold operation 4. The SAR logic circuit 500 stores in register Reg1 corresponding to bit D1 the logic of the comparison result signal output from the comparator 490 as a result of comparison between the voltage on the common node of the CDAC circuit 410, that is, the voltage Vouts of the successive approximation signal Vout, and the voltage Vcms of the reference signal Vcm.

The SAR logic circuit 500 then outputs a logic-low Bit-0 signal. Since the comparator 490 outputs a logic-low comparison result signal, the SAR logic circuit 500 outputs logic-low Bit-1 signal. Accordingly, the SAR logic circuit 100 sets a bit signal {1000}.

In the period between times T08 and T09, the SAR logic circuit 500 performs sampling operation 1. In order to preserve the result of hold operation 4, the SAR logic circuit 500 stores in register Reg0 the logic of the comparison result signal output from the comparator 490 as a result of comparison between the voltage on the common node of the CDAC circuit 410, that is, the voltage Vouts of the successive approximation signal Vout, and the voltage Vcms of the reference signal Vcm.

In the period between times T09 and T10, the SAR logic circuit 500 performs sampling operation 2. As a result, at time T10, {1000} stored in registers Reg 3 to Reg 0 is output as the bits (signals D3, D2, D1, and D0) of the digital signal D [3:0] from the SAR logic circuit 500.

Then the SAR logic circuit 500 repeats the operation it performed in the period between times T02 and T08.

In summary, the analog-to-digital converter circuit 400 according to the third exemplary embodiment includes:

a capacitor array (capacitor array 414) including a plurality of first capacitors (capacitors 416a, 416b, 416c, 416d, and 416e), each having a first terminal connecting to a common node and having a capacitance represented by the nth power of 2 ($2^n$) (where n is a positive integer) on the basis of the smallest of the capacitances of the first capacitors=1;

a switch array including a plurality of first switches (417a, 417b, 417c, 417d, and 417e) alternately supplying and disconnecting one of a first reference voltage (high-voltage VRHS) and a second reference voltage (low-voltage VRLS) to and from a second terminal of each of the first capacitors;

a second capacitor (capacitor 412) connected to a common node through a third terminal and contributing to attenuation of the voltage on the common node;

a second switch connecting to a fourth terminal of the second capacitor and supplying an input signal (Vin) or a third reference voltage (Vcmh) to the second capacitor;

a third switch (switch 30) connecting to the common node and alternately supplying and disconnecting the third reference voltage (Vcms) to and from the common node;

a comparator (comparator 490) comparing the voltage (Vouts) on the common node with a fourth reference voltage (Vcms); and a control circuit (SAR control circuit 500) controlling the supply and disconnection by the first switches, the supply by the second switch, and the supply and disconnection by the third switch.

The control circuit controls the second and third switches so that the supply of the voltage of the input signal by the second switch and the supply of the fourth reference voltage by the third switch take place at the same time.

The control circuit controls the third switch to disconnect the fourth reference voltage from the common node when the first switches supply the first or second reference voltage to the first capacitors.

Furthermore, the control circuit selects first switches that supply the first reference voltage and first switches that supply the second reference voltage from among the plurality of first switches on the basis of the logic of a signal output from the comparator.

Here, let the total capacitance of the capacitor array equal the smallest of the capacitances of the first capacitors times B and the total capacitance of the first capacitors to which the first reference voltage is being supplied equal the smallest capacitance times A. The control circuit determines on the basis of the logic of the signal output from the comparator whether the value of (C3×(Vins−Vcmhs)−(A−B/2)×C0×(Vrhs−Vils)) is positive or negative, selects first switches to supply the first reference voltage so that the value of (C3×(Vins−Vcmhs)−(A−B/2)×C0×(Vrhs−Vils)) approaches 0, and outputs a digital signal that is a binary expression of the value of A that minimizes (C3×(Vins−Vcmhs)−(A−B/2)×C0×(Vrhs−Vils)).

In the analog-to-digital converter circuit 400 described above, the maximum voltage applied to the common node is decreased by the contribution of the second capacitor (capacitor 412). Therefore, the required withstand voltage of the MOS transistors of the comparator 490 which receives the analog voltage from the common node and compares that analog voltage with the reference voltage may be reduced blow the maximum voltage of the signal amplitude of the analog input signal Vin.

This reduction makes it possible to apply miniaturization technology, which entails reduction of driving voltage, to the MOS transistors of the comparator (comparator 490) which receives a signal on the common node and MOS capacitances to reduce the sizes of the gate electrodes and source/drain regions of the MOS transistors and the thickness of gate insulating films. Furthermore, the maximum voltage applied across the multiple capacitors (such as capacitor 416a) of the capacitor array (capacitor array 414) also decreases. Consequently, the thickness of gate insulting films of MOS capacitances and the size of electrodes of the MOS capacitances may be reduced.

Accordingly, the chip areas occupied by the MOS transistors and MOS capacitances of the analog-to-digital converter circuit 400 may be reduced.

Furthermore, since signals Bit-Dummy, Bit-0, Bit-1, Bit-2, and Bit-3 output from the SAR logic circuit 500 do not require a level shift circuit, the chip area occupied by the analog-to-digital converter circuit 400 may be further reduced.

In the first exemplary embodiment, the input signal needs to drive a relatively large capacitance because the input signal is sampled by passing through a capacitor array. In the third exemplary embodiment, on the other hand, the input signal needs to drive only a small capacitance because the input signal is sampled by passing through the voltage attenuating capacitor 412. Accordingly, the third exemplary embodiment has an advantageous effect that the frequency range of the input signal is broadened.

The analog-to-digital converter circuit 400 of the third exemplary embodiment may be used in an RF receiver 1 in place of the analog-to-digital converter circuit 4 of the first exemplary embodiment. Like the analog-to-digital converter circuit 4, the analog-to-digital converter circuit 400 occupies a reduced area on the semiconductor substrate of an SOC that has the function of the RF receiver 1. Since the analog-to-digital converter circuit 400 itself attenuates the analog voltage of an input signal, the need for providing an attenuator that attenuates signal voltage between the analog-to-digital converter circuit 400 and the DSP demodulator is eliminated. Consequently, the chip area of the entire SOC is reduced.

Since the attenuation of the analog voltage of the input signal is achieved by changing the distribution of charge on the common node by capacitance, a noise component of the analog voltage attenuates at the same time and at the same rate. Accordingly, even though the analog amplitude of the input signal attenuates, an appropriate signal-to-noise ratio between the actual signal and nose is maintained.

The CDAC circuit 410 of the analog-to-digital converter circuit 400 of the third exemplary embodiment uses a switch to supply the reference signal Vcm to the common node. However, given that the input signal Vin and the successive approximation signal Vout are AC signals, the switch may be replaced with resistances. An example will be described as a fourth exemplary embodiment.

Fourth Exemplary Embodiment

Figure 12:
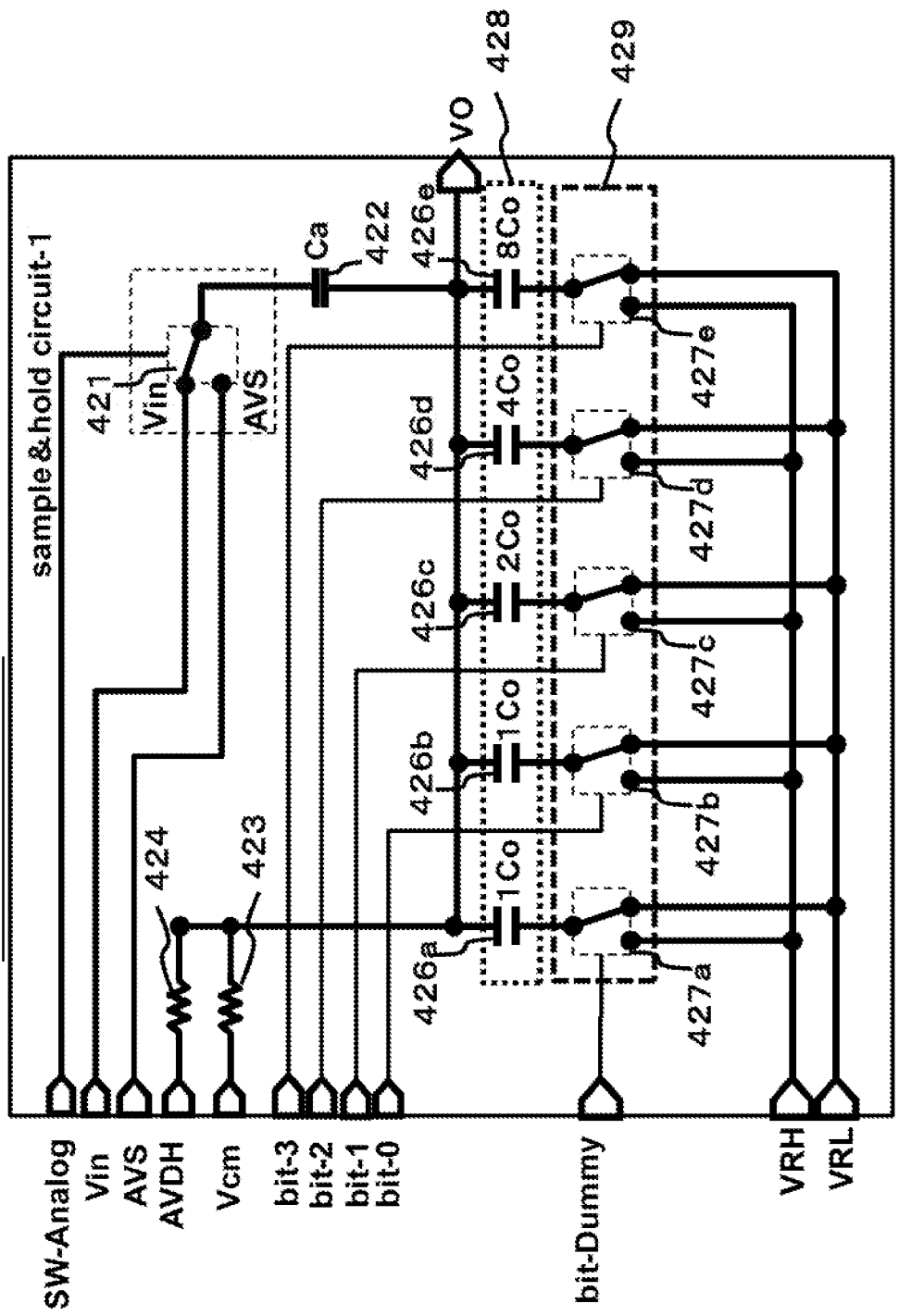
FIG. 12 illustrates a CDAC circuit 420 according to a fourth exemplary embodiment.

FIG. 12 illustrates a CDAC circuit 420 according to the fourth exemplary embodiment. The CDAC circuit 420 includes a switch 421, a capacitor 422, resistances 423 and 424, a capacitor array 428, and a switch array 429. The CDAC circuit 420 is controlled by a first variation of the SAR logic circuit 500. The first variation of the analog-to-digital converter circuit 400 according to the fourth exemplary embodiment includes a CDAC circuit 420 in place of the CDAC circuit 410 of the analog-to-digital converter circuit 400, and the first variation of the SAR logic circuit 500 in place of the SAR logic circuit 500.

One electrode of the capacitor 422 is connected to a common node of the capacitor array 428.

The other electrode of the capacitor 422 is connected to one terminal of the switch 421. The other two terminals of the switch 421 connect to a reference signal AVS and an input signal Vin. The switch 421 receives a signal SW-analog output from the first variation of the SAR logic circuit 500 and supplies the reference signal AVS or the input signal Vin to the electrode of the capacitor 422 to which the switch 421 is connected according to the logic of the signal SW-analog.

One terminal of the resistance 423 receives a reference signal Vcm and the other terminal of the resistance 423 is connected to the common node of the capacitor array 428 to supply the reference voltage Vcms of the reference signal Vcm onto the common node.

One terminal of the resistance 424 receives a reference signal AVDH and the other terminal of the resistance 424 is connected to the common node of the capacitor array 428 to supply the reference voltage of the reference signal AVDH onto the common node.

The resistances 423 and 424 are DC-coupled to the common node of the capacitor array 428. Accordingly, during the asymptotic behavior of the first variation of the SAR logic circuit 500 to control the voltage on the common node for converting the input signal Vin to a digital signal, that is, DC behavior on the common node, the resistances 423 and 424 effectively isolate the reference signals Vcm and AVDH from the common node.

The capacitor array 428 includes multiple capacitors 426a, 426b, 426c, 426d, and 426e.

One of the electrodes of each of the capacitors 426a, 426b, 426c, 426d, and 426e is connected to the common node. On the basis of the smallest of the capacitances of the capacitors=1. The other capacitors 426a, 426b, 426c, 426d, and 426e have capacitances have capacitances that are represented by $2^n$ (where n is a positive integer). That is, the capacitor array 428 includes capacitors having binary-weighted capacitance values. Specifically, if the capacitance of capacitor 426a is 1×Co (where Co is a positive constant), the capacitance of capacitor 426b is 1×Co, the capacitance of capacitor 426c is 2×Co, the capacitance of capacitor 426d is 4×Co, and the capacitance of capacitor 426e is 8×Co.

The common node is connected to a terminal through which the successive approximation signal Vout is output, and has a voltage equal to that of a successive approximation signal Vout.

The switch array 429 includes switches 427a, 427b, 427c, 427d, and 427e. One of the terminals of each of the switches 427a, 427b, 427c, 427d, and 427e is connected to the other electrode (the electrode that is not connected to the common node) of associated one of the capacitors 426a, 426b, 426c, 426d, and 426e.

The other two terminals of each of the switches 427a, 427b, 427c, 427d, and 427e are connected to the reference signals VRH and VRL. The switches 427a, 427b, 427c, 427d, and 427e supply one of the reference signals VRH and VRL to the electrodes of the capacitors 426a, 426b, 426c, 426d, and 426e to which they are connected according to the logics of signals Bit-Dummy, Bit-0, Bit-1, Bit-2, and Bit-3, respectively, output from the first variation of the SAR logic circuit 500.

In the first variation of the analog-to-digital converter circuit 400, the first variation of the SAR logic circuit 500 and the comparator 490 operate similarly to the SAR logic circuit 500 and the comparator 490 to control the CDAC circuit 420. However, since the configuration of the CDAC circuit 420 differs from that of the CDAC circuit 410, the signals output from the first variation of the SAR logic circuit 500 and their logics differ from those of the SAR logic circuit 500.

Specifically, the CDAC circuit 420 does not need to connect and disconnect the reference signal Vcm to and from the common node, the first variation of the SAR logic circuit 500 does not output signal SW-vcm. The first variation of the SAR logic circuit 500 outputs the other signals SW-analog, Bit-0, Bit-1, Bit-2, Bit-3, Bit-Dummy, EOC, and digital signal D [3:0] (signals D3, D2, D1, and D0) like the SAR logic circuit 500.

In sampling operation 1 of the first variation of the SAR logic circuit 500, charge Q27 stored on the common node of the CDAC circuit 420 may be obtained by using an equation similar to that used to obtain the charge Q7 stored on the common node of the CDAC circuit 410.

$$Q27 = C3 \times (Vaa - Vins) + B \times C0 \times (Vaa - Vrhs)/2 + B \times C0 \times (Vaa - Vrls)/2 \quad \text{Equation (27)}$$

where C3 is the capacitance of the capacitor 422, B is the total capacitance of the capacitors within the capacitor array 428 divided by C0, and Vaa is Vcms+(Vavdh−Vcms)×R423/(R423+R424). Here, Vavdh is the voltage of the reference signal AVDH, R423 is the resistance value of the resistance 423, and R424 is the resistance value of the resistance 424.

Charge Q28 stored on the common node in hold operations 1 through 4 of the SAR logic circuit 500 may be obtained by using an equation similar to that used to obtain the charge Q8 stored on the common node of the CDAC circuit 410.

$$Q28 = (Vouts - Vrhs) \times A \times C0 + (B-A)(Vouts - Vrls) \times C0 + (Vouts - Vavs) \times C3 \quad \text{Equation (28)}$$

Here, A is the total capacitance of the capacitors among the capacitors in the capacitor array 428 to which the high-voltage signal VRH is applied divided by C0. Vavs is the voltage of the reference signal AVS.

From Equations (27) and (28) it follows that $$Vouts = Vaa - C3 \times (Vins - Vavs)/(B \times C0 + C3) + (A-B/2) \times C0 \times (Vrhs - Vrls)/(B \times C0 + C3) \quad \text{Equation (29)}$$

From Equation (29), the amplitude voltage Vins of the input signal Vin is attenuated by the voltage attenuating capacitor 422 to C3/(B×C0+C3) and then is output as the voltage on the common node, that is, the voltage Vouts of the successive approximation signal Vout. Therefore, the required withstand voltage of the MOS transistor constituting the comparator 490, which receives an analog voltage from the common node and compares that analog voltage with the reference voltage, may be reduced blow the maximum voltage of the signal amplitude of the analog input signal Vin.

The voltage of the reference signal input into the other terminal of the comparator 490 (the terminal in which the successive approximation signal Vouts is not input) in the fourth exemplary embodiment is Vaa. If (Vavdh−Vcms)×R423/(R423+R424) is equal to Vavs×C3/(B×C0+C3), the voltage of the reference signal input into the other terminal (the terminal in which the successive approximation signal Vouts is not input) of the comparator 490 is Vcms.

In summary, the first variation of the analog-to-digital converter circuit 400 using the first variation of the SAR logic circuit 500 and the CDAC circuit 420 according to the fourth exemplary embodiment includes:

a capacitor array (capacitor array 428) including a plurality of first capacitors (capacitors 426a, 426b, 426c, 426d, and 426e), each having a first terminal connecting to a common node and having a capacitance represented by the nth power of 2 ($2^n$) (where n is a positive integer) on the basis of the smallest of the capacitances of the first capacitors=1;

a switch array (429) including a plurality of first switches (427a, 427b, 427c, 427d, and 427e) alternately supplying and disconnecting one of a first reference voltage (high-voltage VRHS) and a second reference voltage (low-voltage VRLS) to and from a second terminal of each of the first capacitors;

a second capacitor (capacitor 422) connected to a common node through a third terminal and contributing to attenuation of the voltage on the common node;

a second switch connecting to a fourth terminal of the second capacitor and supplying an input signal (Vin) or a third reference voltage (Vavs) to the second capacitor;

a first resistance (resistance 423) connected to the common node and supplying a third reference voltage (Vcms) to the common node;

a second resistance (resistance 424) connected to the common node and supplying a fourth reference voltage (Vavdh) to the common node;

a comparator (comparator 490) comparing the voltage (Vouts) on the common node with a fifth reference voltage (Vcms); and a control circuit (a variation of the SAR control circuit 500) controlling the supply and disconnection by the first switches and the supply by the second switch.

The first variation of the analog-to-digital converter circuit 400 according to the fourth exemplary embodiment operates similarly to the analog-to-digital converter circuit 400 of the third exemplary embodiment.

Accordingly, the first variation of the analog-to-digital converter circuit 400 according to the fourth exemplary embodiment has the advantageous effects as those of the analog-to-digital converter circuit 400 according to the third exemplary embodiment.

In addition, since a switch that connects the reference signal Vcm onto the common node is not required, the chip area occupied by the CDAC circuit 420 is reduced and therefore the chip area of the first variation of the analog-to-digital converter circuit 400 according to the fourth exemplary embodiment is reduced.

Fifth Exemplary Embodiment

FIG. 13 illustrates a CDAC circuit 430 according to a fifth exemplary embodiment. The CDAC circuit 430 includes switches 431 and 432, capacitors 433 and 434, a switch 435, a capacitor array 438, and a switch array 439. The CDAC circuit 430 is controlled by a second variation of the SAR logic circuit 500. A second variation of the analog-to-digital converter circuit 400 according to the fifth exemplary embodiment includes a CDAC circuit 430 in place of the CDAC circuit 410 of the analog-to-digital converter circuit 400, and the second variation of the SAR logic circuit 500 in place of the SAR logic circuit 500.

One of the electrodes of the capacitor 433 is connected to a common node of the capacitor array 438.

The other electrode of the capacitor 433 is connected to one of the terminals of the switch 432. The other two terminals of the switch 432 connect to a reference signal AVDH and an input signal Vin. The switch 432 receives a signal SW-analog output from the second variation of the SAR logic circuit 500 and supplies the reference signal AVDH or the input signal Vin to the electrode of the capacitor 433 to which the switch 432 is connected according to the logic of the signal SW-analog.

One of the electrodes of the capacitor 434 is connected to the common node of the capacitor array 438.

The other electrode of the capacitor 434 is connected to one of the terminals of the switch 431. The other two terminals of the switch 431 connect to a reference signal AVSH and the input signal Vin. The switch 431 receives the signal SW-analog output from the second variation of the SAR logic circuit 500 and supplies the reference signal AVSH or the input signal Vin to the electrode of the capacitor 434 to which the switch 431 is connected according to the logic of the signal SW-analog.

The capacitor array 438 includes multiple capacitors 436a, 436b, 436c, 436d, and 436e.

One of the electrodes of each of the capacitors 436a, 436b, 436c, 436d, and 436e is connected to the common node. The capacitors 436a, 436b, 436c, 436d, and 436e have capacitances that are represented by $2^n$ (where n is a positive integer) on the basis of the smallest of the capacitances of the capacitors=1. That is, the capacitor array 438 includes capacitors having binary-weighted capacitance values. Specifically, if the capacitance of capacitor 436a is 1×Co (where Co is a positive constant), the capacitance of capacitor 436b is 1×Co, the capacitance of capacitor 436c is 2×Co, the capacitance of capacitor 436d is 4×Co, and the capacitance of capacitor 436e is 8×Co.

The common node is connected to a terminal through which a successive approximation signal Vout is output, and has a voltage equal to that of the successive approximation signal Vout.

The switch array 439 includes switches 437a, 437b, 437c, 437d, and 437e. One of the terminals of each of the switches 437a, 437b, 437c, 437d, and 437e is connected to the other electrode (the electrode that is not connected to the common node) of associated one of the capacitors 436a, 436b, 436c, 436d, and 436e.

The other two terminals of each of the switches 437a, 437b, 437c, 437d, and 437e are connected to the reference signals VRH and VRL. The switches 437a, 437b, 437c, 437d, and 437e supply one of the reference signals VRH and VRL to the electrode of the capacitors 436a, 436b, 436c, 436d, and 436e to which they are connected according to the logics of signals Bit-Dummy, Bit-0, Bit-1, Bit-2, and Bit-3, respectively, output from the second variation of the SAR logic circuit 500.

One terminal of the switch 435 receives a reference signal Vcm and the other terminal connects to the common node of the capacitor array 438. The switch 435 connects and disconnects the reference signal Vcm to and from the common node according to the logic of the signal SW-Vcm.

In the second variation of the analog-to-digital converter circuit 400, the second variation of the SAR logic circuit 500 and the comparator 490 operate similarly to the SAR logic circuit 500 and the comparator 490 to control the CDAC circuit 430. While the configuration of the CDAC circuit 430 differs from that of the CDAC circuit 410, the signals output from the second variation of the SAR logic circuit 500 and their logics are the same as those of the SAR logic circuit 500.

Specifically, the second variation of the SAR logic circuit 500 outputs signals SW-vcm, SW-Analog, Bit-0, Bit-1, Bit-2, Bit-3, Bit-Dummy, EOC, and digital signal D [3:0] (signals D3, D2, D1, and D0).

In sampling operation 1 of the second variation of the SAR logic circuit 500, charge Q37 stored on the common node of the CDAC circuit 430 may be obtained using an equation similar to that used to obtain the charge Q7 stored on the common node of the CDAC circuit 430.

$$Q37 = (C4+C5) \times (Vcms-Vins) + B \times C0 \times (Vcms-Vrhs)/2 + B \times C0 \times (Vcms-Vrls)/2 \quad \text{Equation (37)}$$

where C4 is the capacitance of the capacitor 433, C5 is the capacitance of the capacitor 434, and B is the total capacitance of the capacitors in the capacitor array 438 divided by C0.

Charge Q38 stored on the common node in hold operations 1 through 4 of the second variation of the SAR logic circuit 500 may be obtained using an equation similar to that used to obtain the charge Q8 stored on the common node of the CDAC circuit 430.

$$Q38 = (Vouts-Vrhs) \times A \times C0 + (B-A)(Vouts-Vrls) \times C0 + (Vouts-Vavsh) \times C4 + (Vouts-Vavdh) \times C5 \quad \text{Equation (38)}$$

where, A is the total capacitance of the capacitors among the capacitors in the capacitor array 438 to which the high-voltage signal VRH is applied divided by C0, Vavsh is the voltage of the reference signal AVSH, and Vavdh is the voltage of the reference signal AVDH.

From Equations (37) and (38) it follows that $$Vouts = Vcms - (C4+C5) \times (Vins-Vavs)/(B \times C0+C4+C5) + (A-B/2) \times C0 \times (Vrhs-Vrls)/(B \times C0+C4+C5) + (Vavsh \times C4 + Vavdh \times C5)/(B \times C0+C4+C5) \quad \text{Equation (39)}$$

From Equation (39), the amplitude voltage Vins of the input signal Vin is attenuated by the voltage attenuating capacitors 433 and 434 to (C4+C5)/(B×C0+C4+C5) and then is output as the voltage on the common node, that is, the voltage Vouts of the successive approximation signal Vout. Therefore, the required withstand voltage of the MOS transistors constituting the comparator 490, which receives a voltage from the common node, and compares that analog voltage with the reference voltage, may be reduced blow the maximum voltage of the signal amplitude of the analog input signal Vin.

In the fifth exemplary embodiment, the voltage of the reference signal input into the other terminal of the comparator 490 (the terminal in which the successive approximation signal Vouts is not input) is Vcms.

In summary, the second variation of the analog-to-digital converter circuit 400 using the second variation of the SAR logic circuit 500 and the CDAC circuit 430 according to the fifth exemplary embodiment includes:

a capacitor array (capacitor array 438) including a plurality of first capacitors (capacitors 436a, 436b, 436c, 436d, and 436e), each having a first terminal connecting to a common node and having a capacitance represented by the nth power of 2 ($2^n$) (where n is a positive integer) on the basis of the smallest of the capacitances of the first capacitors=1;

a switch array (439) including a plurality of first switches (437a, 437b, 437c, 437d, and 437e) alternately supplying and disconnecting one of a first reference voltage (high-voltage VRHS) and a second reference voltage (low-voltage VRLS) to and from a second terminal of each of the first capacitors;

a second switch (435) connected to the common node and alternately supplying and disconnecting a third reference voltage (Vcms) to and from the common node;

a second capacitor (capacitor 433) connected to the common node through a third terminal and contributing to attenuation of the voltage on the common node;

a third switch (431) connected to a fourth terminal of the second capacitor and supplying an input signal (Vin) or a fourth reference voltage (Vavsh) to the second capacitor;

a third capacitor (434) connected to the common node through a fifth terminal and contributing to attenuation of the voltage on the common node;

a fourth switch (432) connected to a sixth terminal of the third capacitor and supplies the input signal (Vin) or a fifth reference voltage (Vavdh);

a comparator (comparator 490) comparing the voltage (Vouts) on the common node with the sixth reference voltage (Vcms); and a control circuit (the second variation of the SAR control circuit 500) controlling the supply and disconnection by the first switches, the supply and disconnection by the second switch, the supply and disconnection by the third switch, and the supply and disconnection by the fourth switch.

The second variation of the analog-to-digital converter circuit 400 according to the fifth exemplary embodiment operates similarly to the analog-to-digital converter circuit 400 of the third exemplary embodiment.

Accordingly, the second variation of the analog-to-digital converter circuit 400 according to the fifth exemplary embodiment has the same advantageous effects as those of the analog-to-digital converter circuit 400 according to the third exemplary embodiment.

Sixth Exemplary Embodiment

FIG. 14 illustrates a CDAC circuit 440 according to a sixth exemplary embodiment. The CDAC circuit 440 includes multiple sample and hold circuits 441n (where n is a positive integer indicating suffix number consecutively assigned to each of the sample and hold circuits provided), a switch 445, a capacitor array 448, and a switch array 449. The CDAC circuit 440 is controlled by a third variation of the SAR logic circuit 500. A third variation of the analog-to-digital converter circuit 400 according to the sixth exemplary embodiment includes a CDAC circuit 440 in place of the CDAC circuit 410 of the analog-to-digital converter circuit 400, and the third variation of the SAR logic circuit 500 in place of the SAR logic circuit 500.

Each of the sample and hold circuit 441n includes a switch 442n, a capacitor 443n, and a switch 444n.

One of the electrodes of the capacitor 443n is connected to a common node of the capacitor array 448.

The other electrode of the capacitor 443n is connected to one of the terminals of the switch 442. The other two terminals of the switch 442n are connected to a reference signal VCMH and an input signal Vin. The switch 442 supplies the reference signal VCMH or the input signal Vin to the electrode of the capacitor 443n connected to the switch 442 according to the logic of a signal from one of the terminals of the switch 444n.

The other terminal of the switch 444n receives a signal SW-Analog output from the third variation of the SAR logic circuit 500. The switch 444n outputs a signal through the terminal connected to the switch 442n to the switch 442n according to the logic of a signal EN-attn output from the third variation of the SAR logic circuit 500 (where n is a positive integer corresponding to the suffix number consecutively assigned to each of the sample and hold circuits provided).

The signal EN-attn (where n is a positive integer corresponding to the suffix number consecutively assigned to each of the sample and hold circuits provided) is a signal that activates the sample and hold circuit 441n. Five sample and hold circuits 441n are provided in the present exemplary embodiment. The logic of the signal EN-attn determines which of the five sample and hold circuits 441n are to be activated. The activation of the sample and hold circuit 441n is accomplished by passing the signal SW-analog through the switch 444n associated with the sample and hold circuit 441n.

The capacitor array 448 includes multiple capacitors 446a, 446b, 446c, 446d, and 446e.

One of the electrodes of each of the capacitors 446a, 446b, 446c, 446d, and 446e is connected to the common node. On the basis of the smallest of the capacitances 446a, 446b, 446c, 446d, and 446e of the capacitors=1. The other capacitors have capacitances that are represented by $2^n$ (where n is a positive integer). That is, the capacitor array 448 includes capacitors having binary-weighted capacitance values. Specifically, if the capacitance of capacitor 446a is 1×Co (where Co is a positive constant), the capacitance of capacitor 446b is 1×Co, the capacitance of capacitor 446c is 2×Co, the capacitance of capacitor 446d is 4×Co, and the capacitance of capacitor 446e is 8×Co.

The common node is connected to a terminal through which a successive approximation signal Vout is output, and has a voltage equal to that of the successive approximation signal Vout.

The switch array 449 includes switches 447a, 447b, 447c, 447d, and 447e. One of the terminals of each of the switches 447a, 447b, 447c, 447d, and 447e is connected to the other electrode (the electrode that is not connected to the common node) of associated one of the capacitors 446a, 446b, 446c, 446d, and 446e.

The other two terminals of each of the switches 447a, 447b, 447c, 447d, and 447e are connected to the reference signals VRH and VRL. The switches 447a, 447b, 447c, 447d, and 447e supply one of the reference signals VRH and VRL to the electrode of the capacitors 446a, 446b, 446c, 446d, and 446e to which they are connected according to the logics of signals Bit-Dummy, Bit-0, Bit-1, Bit-2, and Bit-3, respectively, output from the third variation of the SAR logic circuit 500.

One terminal of the switch 445 receives a reference signal Vcm and the other terminal connects to the common node of the capacitor array 438. The switch 445 connects and disconnects the reference signal Vcm to and from the common node according to the logic of the signal SW-Vcm.

In the third variation of the analog-to-digital converter circuit 400, the third variation of the SAR logic circuit 500 and the comparator 490 operate similarly to the SAR logic circuit 500 and the comparator 490 to control the CDAC circuit 440. However, since the configuration of the CDAC circuit 440 differs from the CDAC circuit 410, the third variation of the SAR logic circuit 500 differs from the SAR logic circuit 500 in that the third variation outputs the signal EN-attn in addition to those output from the SAR logic circuit 500.

Specifically, the third variation of the SAR logic circuit 500 outputs signals SW-vcm, SW-Analog, Bit-0, Bit-1, Bit-2, Bit-3, Bit-Dummy, EOC, and digital signal D [3:0] (signals D3, D2, D1, and D0) besides the signal EN-attn.

In sampling operation 1 of the third variation of the SAR logic circuit 500, the amount of charge Q47 stored on the common node of the CDAC circuit 440 may be obtained using an equation similar to that used to obtain the charge Q7 stored on the common node of the CDAC circuit 410.

$$Q47 = C6 \times (Vcms - Vins) + B \times C0 \times (Vcms - Vrhs)/2 + B \times C0 \times (Vcms - Vrls)/2 \quad \text{Equation (47)}$$

where C6 is the capacitance of the capacitor 433*a* multiplied by the number of activated sample and hold circuits 441*n*, and B is the total capacitance of the capacitors in the capacitor array 448 divided by C0.

The amount of charge Q48 stored on the common node in hold operations 1 through 4 of the third variation of the SAR logic circuit 500 may be obtained using an equation similar to that used to obtain the charge stored on the common node of the CDAC circuit 410.

$$Q48 = (Vouts - Vrhs) \times A \times C0 + (B - A)(Vouts - Vrls) \times C0 + (Vouts - Vcmhs) \times C6 \quad \text{Equation (48)}$$

where A is the total capacitance of the capacitors among the capacitors in the capacitor array 448 to which the high-voltage signal VRH is applied divided by C0, and Vcmhs is the voltage of the reference signal Vcmh.

Since charge Q47 equals charge Q48, it follows from Equations (47) and (48) that:

$$Vouts = Vcm - C6 \times (Vins - Vcmhs)/(B \times C0 + C6) + (A - B/2) \times C0 \times (Vrhs - Vrls)/(B \times C0 + C6) \quad \text{Equation (49)}$$

From Equation (49), the amplitude voltage Vins of the input signal Vin is attenuated by the voltage attenuating capacitors 443*a* to C6/(B×C0+C6) and then is output as the voltage on the common node, that is, the voltage Vouts of the successive approximation signal Vout. Therefore, the required withstand voltage of the MOS transistors constituting the comparator 490, which receives a voltage from the common node, and compares that analog voltage with the reference voltage, may be reduced blow the maximum voltage of the signal amplitude of the analog input signal Vin.

In the sixth exemplary embodiment, the voltage of the reference signal input into the other terminal (the terminal in which the successive approximation signal Vouts is not input) of the comparator 490 is Vcms.

In summary, the third variation of the analog-to-digital converter circuit 400 using the third variation of the SAR logic circuit 500 and the CDAC circuit 440 according to the sixth exemplary embodiment includes:

a capacitor array (capacitor array 448) including a plurality of first capacitors (capacitors 446*a*, 446*b*, 446*c*, 446*d*, and 446*e*), each having a first terminal connecting to a common node and having a capacitance represented by the nth power of 2 ($2^n$) (where n is a positive integer) on the basis of the smallest of the capacitances of the first capacitors=1;

a switch array (449) including a plurality of first switches (447*a*, 447*b*, 447*c*, 447*d*, and 447*e*) alternately supplying and disconnecting one of a first reference voltage (high-voltage VRHS) and a second reference voltage (low-voltage VRLS) to and from a second terminal of each of the first capacitors;

a second switch (445) connected to the common node and alternately supplying and disconnecting a third reference voltage (Vcms) to and from the common node;

a second capacitor (capacitor 443*a*) connected to the common node through a third terminal and contributing to attenuation of the voltage on the common node;

a third switch connected to a fourth terminal of the second capacitor and supplying an input signal (Vin) or a fourth reference voltage (Vcmh) to the second capacitor;

a comparator (comparator 490) comparing the voltage (Vouts) on the common node with a fifth reference voltage (Vcms); and a control circuit (the third variation of the SAR control circuit 500) controlling the supply and disconnection by the first switches, the supply and disconnection by the second switch, and the supply and disconnection by the third switch.

The third variation of the analog-to-digital converter circuit 400 according to the sixth exemplary embodiment operates similarly to the analog-to-digital converter circuit 400 of the third exemplary embodiment.

Accordingly, the third variation of the analog-to-digital converter circuit 400 according to the sixth exemplary embodiment has the same advantageous effects as those of the analog-to-digital converter circuit 400 according to the third exemplary embodiment.

Seventh Exemplary Embodiment

FIG. 15 illustrates a CDAC circuit 450 according to a seventh exemplary embodiment. The CDAC circuit 450 includes an inverter 451, multiple sample and hold circuits 460*n* (where n is a positive integer indicating suffix number consecutively assigned to each of the sample and hold circuits provided), a switch 455, a capacitor array 458, and a switch array 459. The CDAC circuit 450 is controlled by a fourth variation of the SAR logic circuit 500. A fourth variation of the analog-to-digital converter circuit 400 according to the seventh exemplary embodiment includes a CDAC circuit 450 in place of the CDAC circuit 410 of the analog-to-digital converter circuit 400, and the fourth variation of the SAR logic circuit 500 in place of the SAR logic circuit 500.

Each of the sample and hold circuit 460*n* includes inverters 461*n* and 462*n*, an AND circuits 463*n* and 466*n*, OR circuits 464*n* and 465*n*, switches 467*n* and 468*n*, a P-channel transistor 471*n*, an N-channel transistor 472*n*, and capacitors 473*n* and 474*n*.

The inverter 462*n* receives a signal EN-attn and outputs its inverted signal INVEN-attn.

The inverter 461*n* receives a signal SW-analog and outputs its inverted signal INVSW-analog.

The AND circuit 463*n* receives the signals EN-atten and the inverted INVSW-analog signal and outputs a signal AND-attn-analog representing the AND of the two signals.

The OR circuit 464*n* receives the SW-analog and the inverted signal INVEN-attn and outputs a signal OR-attn-analog representing the OR of the two signals.

The AND circuit 465*n* receives the inverted signal INVEN-attn and the signal AND-attn-analog and outputs a signal AND-attn-AND-attn-analog representing the AND of the two signals.

The OR circuit 466*n* receives the signal EN-attn and the signal OR-attn-analog and outputs a signal OR-attn-OR-attn-analog representing the OR of the two signals.

Each of the switches 467*n* and 468*n* includes a PMOS transistor and NMOS transistor provided in parallel between the input and output terminals. The gate electrode of the PMOS transistor receives the signal OR-attn-analog and the gate electrode of the NMOS transistor receives the signal AND-attn-analog. The switch 467n, 468n supplies an input signal Vin to one of the electrodes of the capacitor 473n, 474n when the signal SW-analog is logic-low and the signal EN-attn is logic-high.

The other electrode of the capacitor 473n, 474n is connected to a common node of the capacitor array 458.

The PMOS transistor 471n receives the signal AND-attn-AND-attn-analog at its gate electrode and supplies the voltage Vavdhs of a signal AVDH to one of the capacitor 473n when the signal EN-attn is logic-low or the signal SW-analog is logic-high.

The NMOS transistor 472n receives the signal OR-attn-OR-attn-analog at its gate electrode and supplies the voltage Vavshs of a signal AVSH to one of the electrodes of the capacitor 474n when the signal EN-attn is logic-low or the signal SW-analog is logic-high.

The signal En-attn (where n is a positive integer indicating suffix number consecutively assigned to each of the sample and hold circuits provided) is a signal that activates the sample and hold circuit 460n. Five sample and hold circuits 460n are provided in the present exemplary embodiment. The logic of the signal En-attn (where n is a positive integer indicating suffix number consecutively assigned to each of the sample and hold circuits provided) determines which of the five sample and hold circuits 441n are to be activated.

The capacitor array 458 includes multiple capacitors 456a, 456b, 456c, 456d, and 456e.

One of the electrodes of the capacitors 456a, 456b, 456c, 456d, and 456e is connected to the common node. On the basis of the smallest of the capacitances of the capacitors 456a, 456b, 456c, 456d, and 456e=1. The other capacitors have capacitances that are represented by $2^n$ (where n is a positive integer). That is, the capacitor array 458 includes capacitors having binary-weighted capacitance values. Specifically, if the capacitance of capacitor 456a is 1×Co (where Co is a positive constant), the capacitance of capacitor 456b is 1×Co, the capacitance of capacitor 456c is 2×Co, the capacitance of capacitor 456d is 4×Co, and the capacitance of capacitor 456e is 8×Co.

The common node is connected to a terminal through which a successive approximation signal Vout is output, and has a voltage equal to that of the successive approximation signal Vout.

The switch array 459 includes switches 457a, 457b, 457c, 457d, and 457e. One of the terminals of each of the switches 457a, 457b, 457c, 457d, and 457e is connected to the other electrode (the electrode that is not connected to the common node) of associated one of the capacitors 456a, 456b, 456c, 456d, and 456e.

The other two terminals of each of the switches 457a, 457b, 457c, 457d, and 457e are connected to reference signals VRH and VRL. The switches 457a, 457b, 457c, 457d, and 457e supply one of the reference signals VRH and VRL to the electrode of the capacitors 456a, 456b, 456c, 456d, and 456e to which they are connected according to the logics of signals Bit-Dummy, Bit-0, Bit-1, Bit-2, and Bit-3, respectively, output from the fourth variation of the SAR logic circuit 500. Each of the switches 457a, 457b, 457c, 457d, and 457e includes a PMOS transistor and an NMOS transistor which receive at their gate electrodes signals Bit-Dummy, Bit-0, Bit-1, Bit-2, and Bit-3, respectively. The PMOS transistors receive a reference signal VRH at their source electrodes and connect to their respective capacitors 456a, 456b, 456c, 456d, and 456e at their drain electrodes. The NMOS transistors receive a reference signal VRL at their source electrodes and connect to the respective capacitors 456a, 456b, 456c, 456d, and 456e at their drain electrodes.

The inverter 451 receives a signal SW-vcm and outputs its inverted signal INVSW-vcm.

The switch 455 receives a reference signal Vcm at one of its terminals and connects to a common node of the capacitor array 458 at the other terminal. The switch 455 connects or disconnects the reference signal Vcm to and from the common node according to the logic of the signal SW-Vcm. The switch 455 includes PMOS and NMOS transistors provided in parallel between their terminals. The PMOS and NMOS transistors receive the inverted signal INVSW-vcm and the signal SW-vcm at their gate electrodes.

In the fourth variation of the analog-to-digital converter circuit 400, the fourth variation of the SAR logic circuit 500 and the comparator 490 operate similarly to the SAR logic circuit 500 and the comparator 490 to control the CDAC circuit 450. However, since the configuration of the CDAC circuit 450 differs from the CDAC circuit 410, the fourth variation of the SAR logic circuit 500 differs from the SAR logic circuit 500 in that the fourth variation outputs the signal EN-attn in addition to those output from the SAR logic circuit 500.

Specifically, the fourth variation of the SAR logic circuit 500 outputs signals SW-vcm, SW-Analog, Bit-0, Bit-1, Bit-2, Bit-3, Bit-Dummy, EOC, and digital signal D [3:0] (signals D3, D2, D1, and D0) besides the signal EN-attn.

The amount of charge Q57 stored on the common node of the CDAC circuit 450 in sampling operation 1 of the fourth variation of the SAR logic circuit 500 may be obtained using an equation similar to that used to obtain the charge Q7 stored on the common node of the CDAC circuit 410.

$$Q57=C7\times(Vcms-Vins)+B\times C0\times(Vcms-Vrhs)/2+B\times C0\times(Vcms-Vrls)/2 \quad \text{Equation (57)}$$

where C7 is the capacitance of the capacitor 473n, 474n multiplied by the number of activated sample and hold circuits 460n, and B is the total capacitance of the capacitors in the capacitor array 458 divided by C0.

The amount of charge Q58 stored on the common node in hold operations 1 through 4 of the fourth variation of the SAR logic circuit 500 may be obtained using an equation similar to that used to obtain the charge stored on the common node of the CDAC circuit 410.

$$Q58=(Vouts-Vrhs)\times A\times C0+(B-A)(Vouts-Vrls)\times C0+ (Vouts-Vcmhs)\times C6 \quad \text{Equation (58)}$$

where A is the total capacitance of the capacitors among the capacitors in the capacitor array 458 to which the high-voltage signal VRH is applied divided by C0, and Vcmhs is the voltage of the reference signal Vcmh.

Since charge Q57 equals charge Q58, it follows from Equations (57) and (58) that $$Vouts=Vcms-C7\times(Vins-Vcmhs)/(B\times C0+C7)+(A-B/2)\times C0\times(Vrhs-Vrls)/(B\times C0+C7) \quad \text{Equation (59)}$$

From Equation (59), the amplitude voltage Vins of the input signal Vin is attenuated by the voltage attenuating capacitors 473 and 474 to C7/(B×C0+C7) and then is output as the voltage on the common node, that is, the voltage Vouts of the successive approximation signal Vout. Therefore, the required withstand voltage of the MOS transistors constituting the comparator 490 which receives a voltage from the common node and compares that analog voltage with the reference voltage may be reduced blow the maximum voltage of the signal amplitude of the analog input signal Vin.

In the seventh exemplary embodiment, the voltage of the reference signal input into the other terminal (the terminal in which the successive approximation signal Vouts is not input) of the comparator 490 is Vcms.

In summary, the fourth variation of the analog-to-digital converter circuit 400 using the fourth variation of the SAR logic circuit 500 and the CDAC circuit 450 according to the seventh exemplary embodiment includes:

a capacitor array (capacitor array 458) including a plurality of first capacitors (capacitors 456a, 456b, 456c, 456d, and 456e), each having a first terminal connecting to a common node and having a capacitance represented by the nth power of 2 ($2^n$) (where n is a positive integer) on the basis of the smallest of the capacitances of the first capacitors=1;

a switch array (459) including a plurality of first switches (457a, 457b, 457c, 457d, and 457e) alternately supplying and disconnecting one of a first reference voltage (high-voltage VRHS) and a second reference voltage (low-voltage VRLS) to and from a second terminal of each of the first capacitors;

a second switch (455) connected to the common node and alternately supplying and disconnecting a third reference voltage (Vcms) to and from the common node;

a second capacitor (capacitor 473) connected to the common node through a third terminal and contributing to attenuation of the voltage on the common node;

a third switch connected to a fourth terminal of the second capacitor and supplying an input signal (Vin) or a fourth reference voltage (Vavdhs) to the second capacitor;

a third capacitor (capacitor 474) connected to the common node through a fifth terminal and contributing to attenuation of the voltage on the common node;

a fourth switch connected to a sixth terminal of the second capacitor and supplying the input signal (Vin) or a fifth reference voltage (Vavshs);

a comparator (comparator 490) comparing the voltage (Vouts) on the common node with a sixth reference voltage (Vcms); and a control circuit (the fourth variation of the SAR control circuit 500) controlling the supply and disconnection by the first switches, the supply and disconnection by the second switch, the supply and disconnection by the third switch, and the supply and disconnection by the fourth switch.

The fourth variation of the analog-to-digital converter circuit 400 according to the seventh exemplary embodiment operates similarly to the analog-to-digital converter circuit 400 of the third exemplary embodiment.

Accordingly, the fourth variation of the analog-to-digital converter circuit 400 according to the seventh exemplary embodiment has the same advantageous effects as those of the analog-to-digital converter circuit 400 according to the third exemplary embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An analog-to-digital converter circuit comprising:
    a capacitor array including a plurality of first capacitors, each having a first terminal connecting to a common node and having a capacitance represented by the nth power of 2 ($2^n$) (where n is a positive integer) on the basis of the smallest of the capacitances of the first capacitors=1;
    a switch array including a plurality of first switches alternately supplying and disconnecting one of a first reference voltage and a second reference voltage to and from a second terminal of each of the first capacitors;
    a second capacitor connected to a common node through a third terminal and contributing to attenuation of the voltage on the common node;
    a second switch connecting to a fourth terminal of the second capacitor and supplying an input signal or a fourth reference voltage to the second capacitor;
    a third switch connecting to the common node and alternately supplying and disconnecting the third reference voltage to and from the common node;
    a comparator comparing the voltage on the common node with a fifth reference voltage; and
    a control circuit controlling the supply and disconnection by the first switches, the supply by the second switch, and the supply and disconnection by the third switch.

2. The analog-to-digital converter circuit according to claim 1, wherein the control circuit controls the second and third switch so that the supply of the voltage of the input signal by the second switch and the supply of the fourth reference voltage by the third switch take place at the same time.

3. The analog-to-digital converter circuit according to claim 2, wherein the control circuit controls the third switch to disconnect the fourth reference voltage from the common node when the first or second reference voltage is supplied to the first capacitors by the first switches.

4. The analog-to-digital converter circuit according to claim 1, wherein the control circuit performs control to select first switches that supply first reference voltage and first switches that supply the second reference voltage from among the plurality of first switches on the basis of the logic of a signal output from the comparator.

5. The analog-to-digital converter circuit according to claim 4, wherein the control circuit determines on the basis of the logic of the signal output from the comparator whether the value of (C3×(Vins−Vcmhs)−(A−B/2)×C0×(Vrhs−Vrls)) is positive or negative, performs control to select first switches that supply the first reference voltage so that the value of (C3×(Vins−Vcmhs)−(A−B/2)×C0×(Vrhs−Vils)) approaches 0, and outputs a digital signal that is a binary expression of the value of A that minimizes (C3×(Vins−Vcmhs)−(A−B/2)×C0×(Vrhs−Vils)), where the total capacitance of the capacitor array is equal to the smallest of the capacitances of the first capacitors times B and the total capacitance of the first capacitors to which the first reference voltage is being supplied is equal to the smallest capacitance times A.

6. An analog-to-digital converter circuit according to claim 1, further comprising:
    a third capacitor connected to the common node through a fifth terminal and contributing to attenuation of the voltage on the common node;
    a fourth switch connected to a sixth terminal of the third capacitor and supplies the input signal or a sixth reference voltage, wherein
    a control circuit controlling the supply and disconnection by the first switches, the supply and disconnection by the second switch, the supply and disconnection by the third switch, and the supply and disconnection by the fourth switch.

7. An analog-to-digital converter circuit comprising:
a capacitor array including a plurality of first capacitors, each having a first terminal connecting to a common node and having a capacitance represented by the nth power of 2 ($2^n$) (where n is a positive integer) on the basis of the smallest of the capacitances of the first capacitors=1;
a switch array including a plurality of first switches alternately supplying and disconnecting one of a first reference voltage and a second reference voltage to and from a second terminal of each of the first capacitors;
a second capacitor connected to a common node through a third terminal and contributing to attenuation of the voltage on the common node;
a second switch connecting to a fourth terminal of the second capacitor and supplying an input signal or a third reference voltage to the second capacitor;
a first resistance connected to the common node and supplying the third reference voltage to the common node;
a second resistance connected to the common node and supplying a fourth reference voltage to the common node;
a comparator comparing the voltage on the common node with a fifth reference voltage; and
a control circuit controlling the supply and disconnection by the first switches and the supply by the second switch.

8. An analog-to-digital converter circuit comprising:
a capacitor array including a plurality of first capacitors, each having a first terminal connecting to a common node and having a capacitance represented by the nth power of 2 ($2^n$) (where n is a positive integer) on the basis of the smallest of the capacitances of the first capacitors=1;
a switch array including a plurality of first switches alternately supplying and disconnecting one of a first reference voltage and a second reference voltage to and from a second terminal of each of the first capacitors;
a second switch connected to the common node and alternately supplying and disconnecting a third reference voltage to and from the common node;
a second capacitor connected to the common node through a third terminal and contributing to attenuation of the voltage on the common node;
a third switch connected to a fourth terminal of the second capacitor and supplying an input signal or a fourth reference voltage to the second capacitor;
a comparator comparing the voltage on the common node with a fifth reference voltage; and
a control circuit controlling the supply and disconnection by the first switches, the supply and disconnection by the second switch, and the supply and disconnection by the third switch.

9. An analog-to-digital converter circuit comprising:
a capacitor array including a plurality of first capacitors, each having a first terminal connecting to a common node and having a capacitance represented by the nth power of 2 ($2^n$) (where n is a positive integer) on the basis of the smallest of the capacitances of the first capacitors=1;
a switch array including a plurality of first switches alternately supplying and disconnecting one of a first reference voltage and a second reference voltage to and from a second terminal of each of the first capacitors;
a second switch connected to the common node and alternately supplying and disconnecting a third reference voltage to and from the common node;
a second capacitor connected to the common node through a third terminal and contributing to attenuation of the voltage on the common node;
a third switch connected to a fourth terminal of the second capacitor and supplying an input signal or a fourth reference voltage to the second capacitor;
a third capacitor connected to the common node through a fifth terminal and contributing to attenuation of the voltage on the common node;
a fourth switch connected to a sixth terminal of the second capacitor and supplying the input signal or a fifth reference voltage;
a comparator comparing the voltage on the common node with a sixth reference voltage; and
a control circuit controlling the supply and disconnection by the first switches, the supply and disconnection by the second switch, the supply and disconnection by the third switch, and the supply by the fourth switch.

10. A receiver having an analog-to-digital converter circuit converting the noise-reduced received signal to a digital signal, according to claim 1, the receiver comprising:
a filter circuit reducing noise in a received analog signal;
an amplifier amplifying the noise-reduced received signal; and
a DSP demodulator which recovers the original unmodulated signal from the noise-reduced received signal.

* * * * *